(12) United States Patent
Guyette

(10) Patent No.: US 12,113,512 B2
(45) Date of Patent: Oct. 8, 2024

(54) LAYOUT OF XBARS WITH MULTIPLE SUB-RESONATORS IN PARALLEL

(71) Applicant: Murata Manufacturing Co., Ltd., Nagaokakyo (JP)

(72) Inventor: Andrew Guyette, San Mateo, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 306 days.

(21) Appl. No.: 17/408,264

(22) Filed: Aug. 20, 2021

(65) Prior Publication Data

US 2022/0311416 A1   Sep. 29, 2022

Related U.S. Application Data

(60) Provisional application No. 63/167,510, filed on Mar. 29, 2021.

(51) Int. Cl.
*H03H 9/56* (2006.01)
*H03H 3/02* (2006.01)
*H03H 9/02* (2006.01)
*H03H 9/205* (2006.01)

(52) U.S. Cl.
CPC .............. *H03H 9/568* (2013.01); *H03H 3/02* (2013.01); *H03H 9/02228* (2013.01); *H03H 9/205* (2013.01)

(58) Field of Classification Search
None
See application file for complete search history.

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,631,515 A | 5/1997 | Mineyoshi et al. |
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |

(Continued)

FOREIGN PATENT DOCUMENTS

| | | |
|---|---|---|
| CN | 106788318 A | 5/2017 |
| CN | 110417373 A | 11/2019 |

(Continued)

OTHER PUBLICATIONS

Buchanan "Ceramic Materials for Electronics" 3rd Edition, first published in 2004 by Marcel Dekker, Inc. pp. 496 (Year 2004). 00 Jan. 2004.

(Continued)

*Primary Examiner* — Kenneth B Wells
(74) *Attorney, Agent, or Firm* — ARENTFOX SCHIFF LLP

(57) ABSTRACT

Acoustic filter devices and methods of making filter devices. An acoustic filter device includes a transversely-excited film bulk acoustic resonator (XBAR) including a plurality of sub-resonators and conductors to connect the plurality of sub-resonators in parallel between a first node and a second node. The conductors are configured such that a path length from the first node to the second node is effectively the same through each of the plurality of sub-resonators.

20 Claims, 17 Drawing Sheets

(56) References Cited

U.S. PATENT DOCUMENTS

| | | |
|---|---|---|
| 6,707,229 B1 | 3/2004 | Martin |
| 6,710,514 B2 | 3/2004 | Ikada et al. |
| 6,833,774 B2 | 12/2004 | Abbott et al. |
| 6,914,477 B2 | 7/2005 | Shibahara |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,564,873 B2 | 2/2017 | Kadota |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,391 B2 | 8/2019 | Ito et al. |
| 10,491,192 B1 | 11/2019 | Plesski et al. |
| 10,601,392 B2 | 3/2020 | Plesski et al. |
| 10,637,438 B2 * | 4/2020 | Garcia .................. H03H 9/171 |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 * | 12/2020 | Yantchev .............. H03H 9/568 |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,146,232 B2 | 10/2021 | Yandrapalli et al. |
| 11,201,601 B2 | 12/2021 | Yantchev et al. |
| 11,418,167 B2 | 8/2022 | Garcia |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0099091 A1 | 5/2005 | Mishima et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0131731 A1 | 6/2006 | Sato |
| 2006/0152107 A1 | 7/2006 | Tanaka |
| 2006/0179642 A1 | 8/2006 | Kawamura |
| 2007/0090898 A1 | 4/2007 | Kando |
| 2007/0115079 A1 | 5/2007 | Kubo et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0100397 A1 | 5/2008 | Nam et al. |
| 2008/0246559 A1 | 10/2008 | Ayazi |
| 2008/0297280 A1 | 12/2008 | Thalhammer et al. |
| 2009/0315640 A1 | 12/2009 | Umeda et al. |
| 2010/0026417 A1 | 2/2010 | Kubat et al. |
| 2010/0064492 A1 | 3/2010 | Tanaka |
| 2010/0102669 A1 | 4/2010 | Yamanaka |
| 2010/0123367 A1 | 5/2010 | Tai et al. |
| 2010/0212127 A1 | 8/2010 | Heinze et al. |
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto et al. |
| 2011/0278993 A1 | 11/2011 | Iwamoto |
| 2012/0204388 A1 | 8/2012 | Irokawa |
| 2012/0286900 A1 | 11/2012 | Kadota et al. |
| 2013/0057360 A1 | 3/2013 | Meltaus et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0009247 A1 | 1/2014 | Moriya |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0312994 A1 | 10/2014 | Meltaus et al. |
| 2015/0042417 A1 | 2/2015 | Onodera et al. |
| 2015/0319537 A1 | 11/2015 | Perois et al. |
| 2015/0333730 A1 | 11/2015 | Meltaus et al. |
| 2016/0028367 A1 | 1/2016 | Shealy |
| 2016/0036415 A1 | 2/2016 | Ikeuchi |
| 2016/0049920 A1 | 2/2016 | Kishino |
| 2016/0149554 A1 | 5/2016 | Nakagawa |
| 2016/0182009 A1 | 6/2016 | Bhattacharjee |
| 2017/0063332 A1 | 3/2017 | Gilbert et al. |
| 2017/0104470 A1 | 4/2017 | Koelle et al. |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0214381 A1 | 7/2017 | Bhattacharjee |
| 2017/0214387 A1 | 7/2017 | Burak et al. |
| 2017/0214389 A1 | 7/2017 | Tsutsumi |
| 2017/0222617 A1 | 8/2017 | Mizoguchi |
| 2017/0222622 A1 | 8/2017 | Solal et al. |
| 2017/0290160 A1 | 10/2017 | Takano et al. |
| 2017/0359050 A1 | 12/2017 | Irieda et al. |
| 2017/0370791 A1 | 12/2017 | Nakamura et al. |
| 2018/0005950 A1 | 1/2018 | Watanabe |
| 2018/0013405 A1 | 1/2018 | Takata |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong |
| 2018/0152169 A1 | 5/2018 | Goto et al. |
| 2018/0191322 A1 | 7/2018 | Chang et al. |

(56) References Cited

U.S. PATENT DOCUMENTS

| | | |
|---|---|---|
| 2018/0316333 A1 | 11/2018 | Nakamura et al. |
| 2018/0358948 A1 | 12/2018 | Gong et al. |
| 2019/0007022 A1 | 1/2019 | Goto et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0181825 A1 | 6/2019 | Schmalzl et al. |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin et al. |
| 2019/0348966 A1 | 11/2019 | Campanella-Pineda |
| 2020/0007110 A1 | 1/2020 | Konaka et al. |
| 2020/0036357 A1 | 1/2020 | Mimura |
| 2020/0235719 A1 | 7/2020 | Yantchev et al. |
| 2020/0244247 A1 | 7/2020 | Maeda |
| 2020/0304091 A1 | 9/2020 | Yantchev |
| 2020/0321939 A1 | 10/2020 | Turner et al. |
| 2020/0328728 A1 | 10/2020 | Nakagawa et al. |
| 2020/0373907 A1 | 11/2020 | Garcia |
| 2021/0119606 A1* | 4/2021 | Lu ............ H03H 9/02842 |
| 2021/0242606 A1* | 8/2021 | Sepulveda ............ H01Q 1/38 |
| 2021/0273631 A1 | 9/2021 | Jachowski et al. |
| 2021/0313951 A1 | 10/2021 | Yandrapalli et al. |
| 2022/0103160 A1 | 3/2022 | Jachowski et al. |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| CN | 210431367 U | 4/2020 |
| CN | 113765495 A | 12/2021 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004523179 A | 7/2004 |
| JP | 2004304622 A | 10/2004 |
| JP | 2006173557 A | 6/2006 |
| JP | 2007251910 A | 9/2007 |
| JP | 2007329584 A | 12/2007 |
| JP | 2010062816 A | 3/2010 |
| JP | 2010103803 A | 5/2010 |
| JP | 2010154505 A | 7/2010 |
| JP | 2010233210 A | 10/2010 |
| JP | 2013528996 A | 7/2013 |
| JP | 2013214954 A | 10/2013 |
| JP | 2015054986 A | 3/2015 |
| JP | 2016001923 A | 1/2016 |
| JP | 2017526254 A | 9/2017 |
| JP | 2017220910 A | 12/2017 |
| JP | 2018093487 A | 6/2018 |
| JP | 2018166259 A | 10/2018 |
| JP | 2018207144 A | 12/2018 |
| JP | 2019186655 A | 10/2019 |
| JP | 2020113939 A | 7/2020 |
| JP | 2020155967 A | 9/2020 |
| WO | 2010047114 A1 | 4/2010 |
| WO | 2013021948 A1 | 2/2013 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2018003268 A1 | 1/2018 |
| WO | 2018003273 | 1/2018 |
| WO | 2018163860 A1 | 9/2018 |
| WO | 2019117133 A1 | 6/2019 |
| WO | 2019138810 A1 | 7/2019 |
| WO | 2020092414 A2 | 5/2020 |

OTHER PUBLICATIONS

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.

Zou, Jie "High-Performance Aluminum Nitride Lamb Wave Resonators for RF Front-End Technology" University of California, Berkeley, Summer 2015, pp. 63 (Year 2015) 00 Jan. 2015.

Santosh, G. , Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Material Properties of Tibtech Innovations, © 2018 TIBTECH Innovations (Year 2018). 2018.

USPTO/ISA, International Search Report and Written Opinion for PCT Application No. PCT/US2020/45654 dated Oct. 29, 2020.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

R. Olsson III, K. Hattar et al. "A high electromechanical coupling coefficient SHO Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

(56) References Cited

OTHER PUBLICATIONS

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Chen et al., "Development and Application of SAW Filter," Micromachines, Apr. 20, 2022, vol. 13, No. 656, pp. 1-15.

Herrmann et al., "Properties of shear-horizontal surface acoustic waves in different layered quartz-SiO2 structures," Ultrasonics, 1999, vol. 37, pp. 335-341.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946.

Abass et al. "Effects of inhomogeneous grain size distribution in polycrystalline silicon solar cells", Energy Procedia 10(2011) pp. 55-60 © 2011 Published by Elsevier Ltd.

Gorisse et al., "Lateral Field Excitation of membrane-based Aluminum Nitride resonators", 2011 Joint Conference of the IEEE International Frequency Control and the European Frequency and Time Forum (FCS) Proceedings.

Pang et al., "Self-Aligned Lateral Field Excitation Film Acoustic Resonator with Very Large Electromechanical Coupling", 2004 IEEE International Ultrasonics, Ferroelectrics and Frequency Control Joint 50th Anniversary Conference, pp. 558-561.

Xue et al., "High Q Lateral-Field-Excited Bulk Resonator Based on Single-Crystal LiTaO3 for 5G Wireless Communication", Journal of Electron devices society, Mar. 2021, Introduction.

Yandrapalli et al., "Toward Band n78 Shear Bulk Acoustic Resonators Using Crystalline Y-Cut Lithium Niobate Films with Spurious Suppression", Journal of Microelectromechanical Systems, vol. 32, No. 4, Aug. 2023, pp. 327-334.

* cited by examiner

LAYOUT OF XBARS WITH MULTIPLE SUB-RESONATORS IN PARALLEL

RELATED APPLICATION INFORMATION

This patent claims priority from provisional patent application 63/167,510, filed Mar. 29, 2021, entitled IMPROVED LAYOUT OF XBARS WITH MULTIPLE SUB-RESONATORS IN PARALLEL. The entire content of application 63/108,227 is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHZ, and n79, which uses the frequency range from 4400 MHz to 5000 MHz. Both band n77 and band n79 use time-division duplexing (TDD), such that a communications device operating in band n77 and/or band n79 uses the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
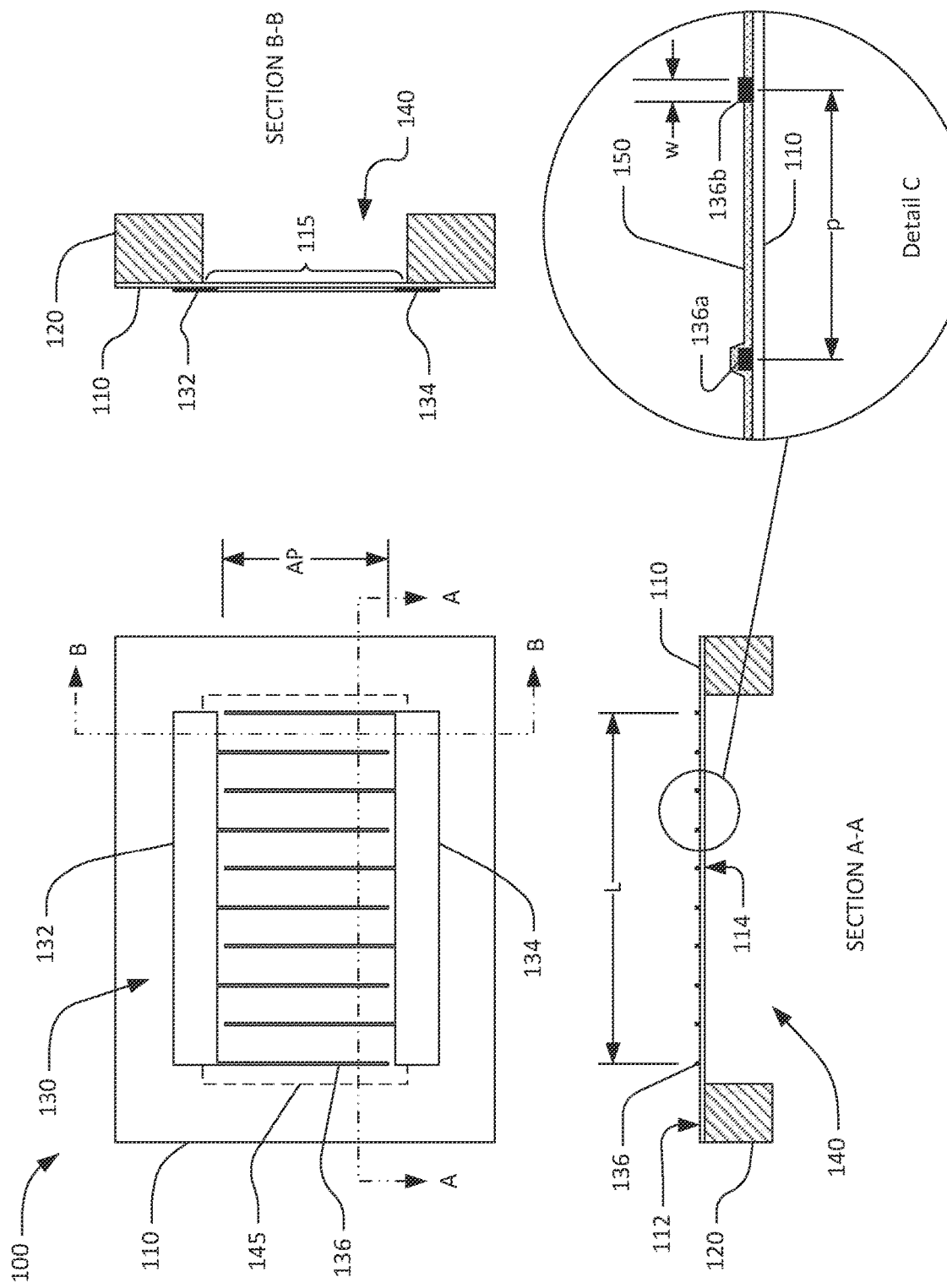
FIG. 1 includes a schematic plan view, two schematic cross-sectional views, and a detailed cross-sectional view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz. The matrix XBAR filters described in this patent are also suited for frequencies above 1 GHz.

The XBAR 100 is made up of a thin film conductor pattern formed on a surface of a piezoelectric plate 110 having substantially parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode of an XBAR is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

The detailed cross-section view (Detail C) shows two IDT fingers 136a, 136b on the surface of the piezoelectric plate 110. The dimension p is the "pitch" of the IDT and the dimension w is the width or "mark" of the IDT fingers. A dielectric layer 150 may be formed between and optionally over (see IDT finger 136a) the IDT fingers. The dielectric layer 150 may be a non-piezoelectric dielectric material, such as silicon dioxide or silicon nitride. The dielectric layer 150 may be formed of multiple layers of two or more materials. The IDT fingers 136a and 136b may be aluminum, copper, beryllium, gold, tungsten, molybdenum, alloys and combinations thereof, or some other conductive material. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars of the IDT 130 may be made of the same or different materials as the fingers.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

Figure 2:
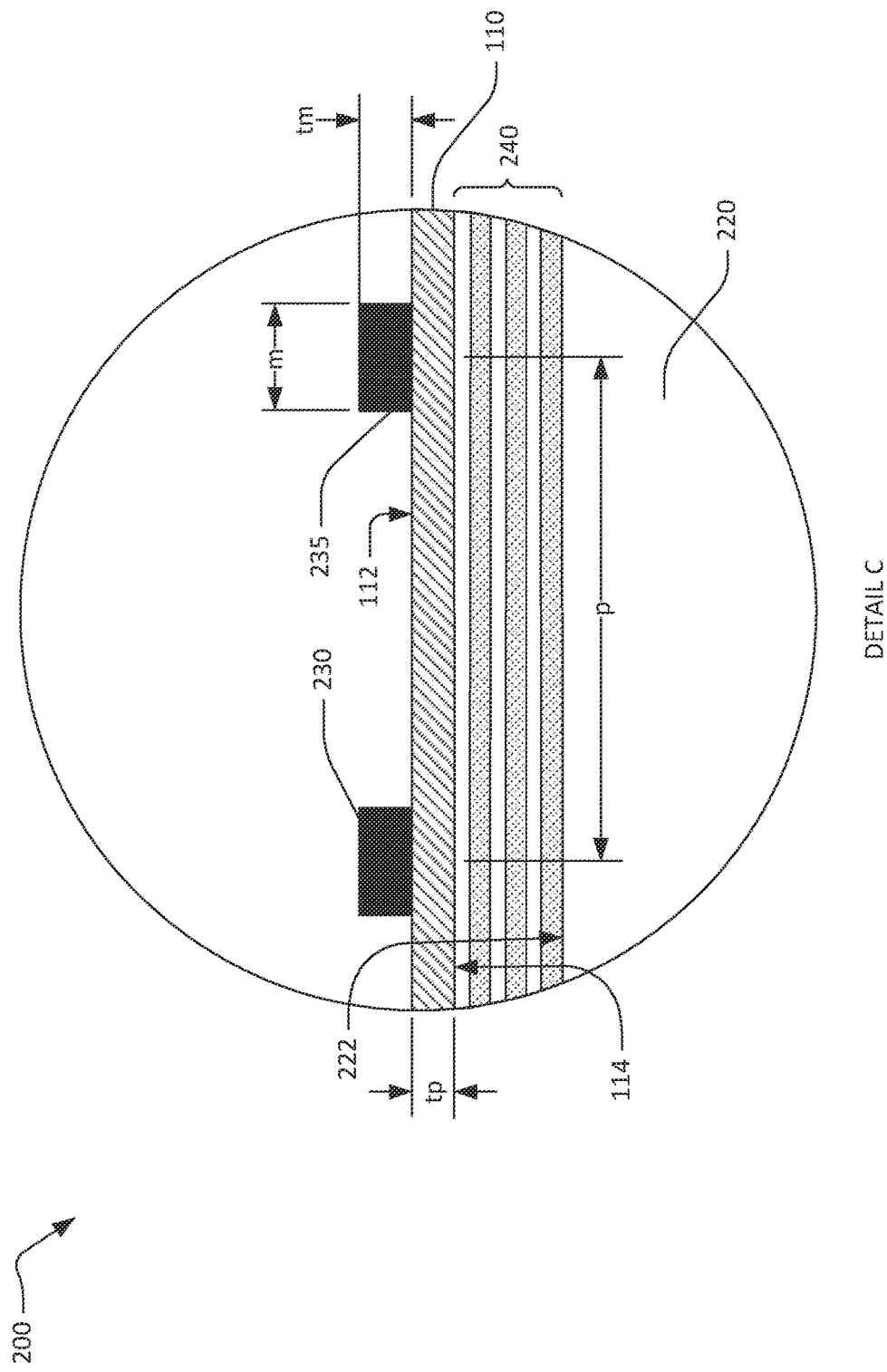
FIG. 2 is an alternative schematic cross-sectional view of an XBAR.

FIG. 2 shows a detailed schematic cross-sectional view of a solidly mounted XBAR (SM XBAR) 200. SM XBARs are first described in patent U.S. Pat. No. 10,601,392. The SM XBAR 200 includes a piezoelectric plate 110 and an IDT (of which only fingers 230 and 235 are visible). The piezoelectric layer 110 has parallel front and back surfaces 112, 114. Dimension tp is the thickness of the piezoelectric plate 110. The width of the IDT fingers 230, 235 is dimension m, thickness of the IDT fingers is dimension tm, and the IDT pitch is dimension p.

In contrast to the XBAR device shown in FIG. 1, the IDT of an SM XBAR is not formed on a diaphragm spanning a cavity in a substrate (120 in FIG. 1). Instead, an acoustic Bragg reflector 240 is between a surface 222 of a substrate 220 and the back surface 114 of the piezoelectric plate 110. The acoustic Bragg reflector 240 is both disposed between and mechanically attached to a surface 222 of the substrate 220 and the back surface 114 of the piezoelectric plate 110. In some circumstances, thin layers of additional materials may be disposed between the acoustic Bragg reflector 240 and the surface 222 of the substrate 220 and/or between the Bragg reflector 240 and the back surface 114 of the piezoelectric plate 110. Such additional material layers may be present, for example, to facilitate bonding the piezoelectric plate 110, the acoustic Bragg reflector 240, and the substrate 220.

The acoustic Bragg reflector 240 includes multiple dielectric layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. As will be discussed subsequently, the primary acoustic mode in the piezoelectric plate of an XBAR is a shear bulk wave. Each of the layers of the acoustic Bragg reflector 240 has a thickness equal to, or about, one-fourth of the wavelength of a shear bulk wave having the same polarization as the primary acoustic mode at or near a resonance frequency of the SM XBAR 200. Dielectric materials having comparatively low acoustic impedance include silicon dioxide, carbon-containing silicon oxide, and certain plastics such as cross-linked polyphenylene polymers. Materials having comparatively high acoustic impedance include hafnium oxide, silicon nitride, aluminum nitride, silicon carbide, and diamond. All of the high acoustic impedance layers of the acoustic Bragg reflector 240 are not necessarily the same material, and all of the low acoustic impedance layers are not necessarily the same material. In the example of FIG. 2, the acoustic Bragg reflector 240 has a total of six layers. An acoustic Bragg reflector may have more than, or less than, six layers.

As shown in FIG. 2, the IDT fingers 230, 235 have rectangular cross-sections. The IDT fingers 230, 235 may have some other cross-section, such as trapezoidal, T-shaped, or stepped. The IDT fingers 230, 235 are shown as single layer structures which may be aluminum or some other metal. IDT fingers may include multiple layers of materials, which may be selected to have different acoustic loss and/or different acoustic impedance. When multiple material layers are used, the cross-sectional shapes of the layers may be different. Further, a thin adhesion layer of another material, such as titanium or chrome, may be formed between the IDT fingers 230, 235 and the piezoelectric plate 110. Although not shown in FIG. 2, some or all IDT fingers may be disposed in grooves or slots extending partially or completely through the piezoelectric plate 110.

Figure 3:
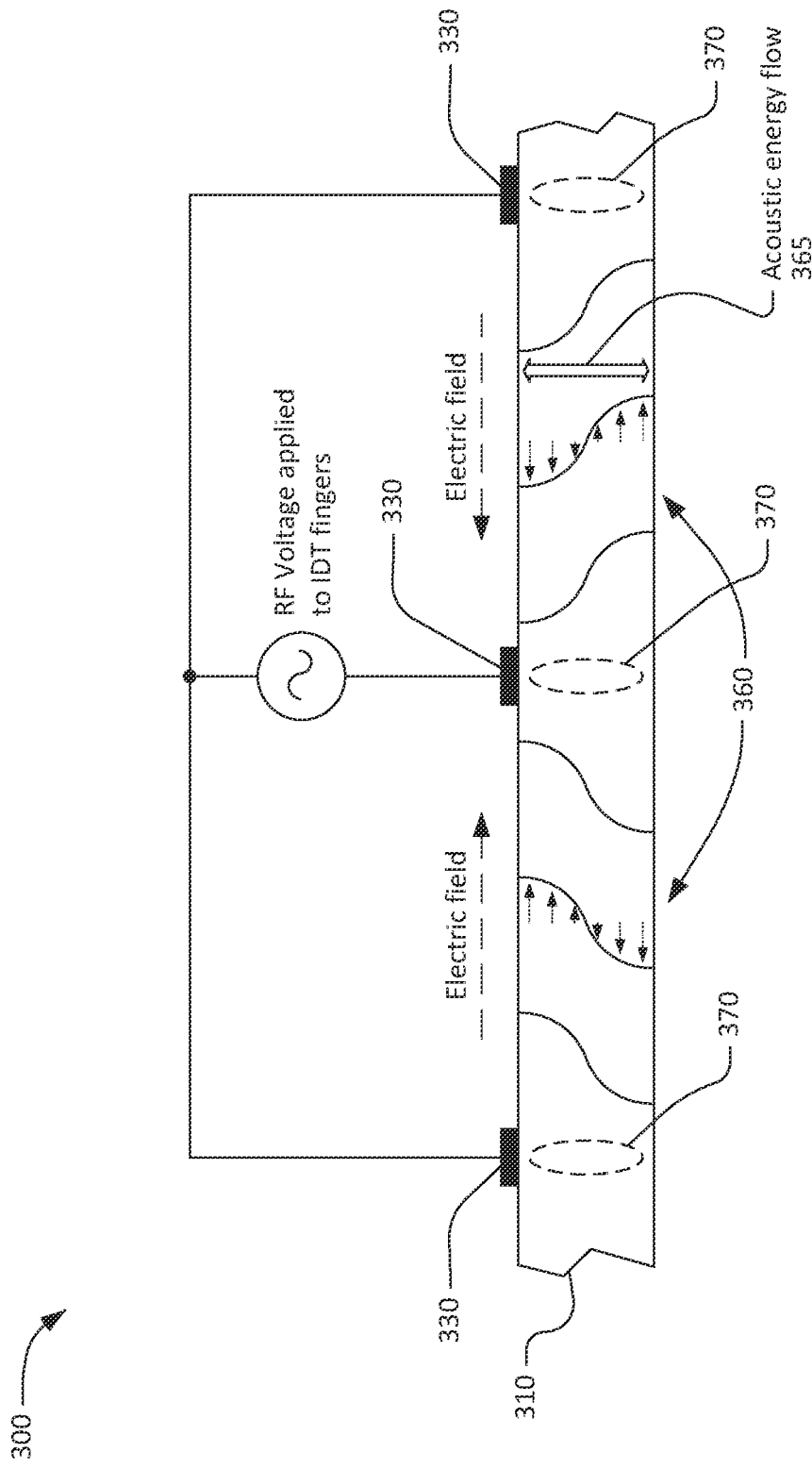
FIG. 3 is a graphic illustrating a primary acoustic mode in an XBAR.

FIG. 3 is a graphical illustration of the primary acoustic mode of interest in an XBAR. FIG. 3 shows a small portion of an XBAR 300 including a piezoelectric plate 310 and three interleaved IDT fingers 330 which alternate in electrical polarity from finger to finger. An RF voltage is applied to the interleaved fingers 330. This voltage creates a time-varying electric field between the fingers. The direction of the electric field is predominantly lateral, or parallel to the surface of the piezoelectric plate 310, as indicated by the arrows labeled "electric field". Due to the high dielectric constant of the piezoelectric plate, the RF electric energy is highly concentrated inside the plate relative to the air. The lateral electric field introduces shear deformation which couples strongly to a shear primary acoustic mode (at a resonance frequency defined by the acoustic cavity formed by the volume between the two surfaces of the piezoelectric plate) in the piezoelectric plate 310. In this context, "shear deformation" is defined as deformation in which parallel planes in a material remain predominantly parallel and maintain constant separation while translating (within their respective planes) relative to each other. A "shear acoustic mode" is defined as an acoustic vibration mode in a medium that results in shear deformation of the medium. The shear deformations in the XBAR 300 are represented by the curves 360, with the adjacent small arrows providing a schematic indication of the direction and relative magnitude of atomic motion at the resonance frequency. The degree of atomic motion, as well as the thickness of the piezoelectric plate 310, have been greatly exaggerated for ease of visualization. While the atomic motions are predominantly lateral (i.e. horizontal as shown in FIG. 3), the direction of acoustic energy flow of the excited primary acoustic mode is substantially orthogonal to the surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4B:
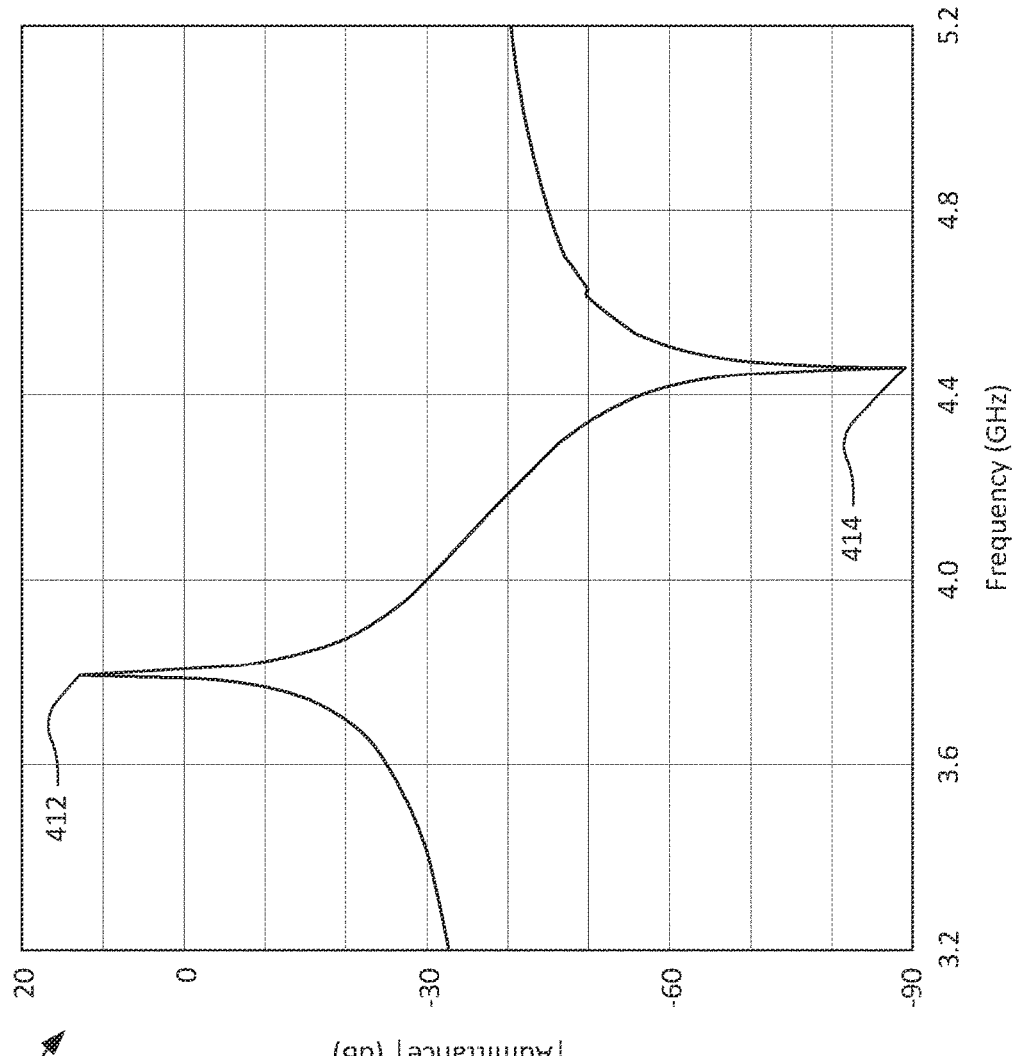
FIG. 4B is a graph of the admittance of an ideal acoustic resonator.
Figure 4A:
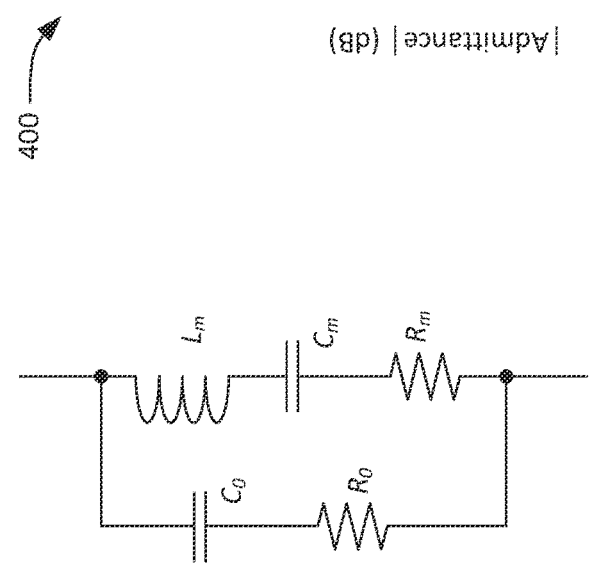
FIG. 4A is an equivalent circuit model of an acoustic resonator.

The basic behavior of acoustic resonators, including XBARs, is commonly described using the Butterworth Van Dyke (BVD) circuit model as shown in FIG. 4A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m$=$R_0$=0), the frequency $F_r$ of the motional resonance is given by $$F_r = \frac{1}{2\pi\sqrt{L_m C_m}} \quad (1)$$

The frequency $F_\alpha$ of the anti-resonance is given by $$F_a = F_r \sqrt{1 + \frac{1}{\gamma}} \quad (2)$$

where $\gamma$=$C_0$/$C_m$ is dependent on the resonator structure and the type and the orientation of the crystalline axes of the piezoelectric material.

FIG. 4B is a graph 400 of the magnitude of admittance of a theoretical lossless acoustic resonator. The acoustic resonator has a resonance 412 at a resonance frequency where the admittance of the resonator approaches infinity. In oversimplified terms, the lossless acoustic resonator can be considered a short circuit at the resonance frequency 412 and an open circuit at the anti-resonance frequency 414. The resonance and anti-resonance frequencies in FIG. 4 are representative, and an acoustic resonator may be designed for other frequencies.

Figure 5:
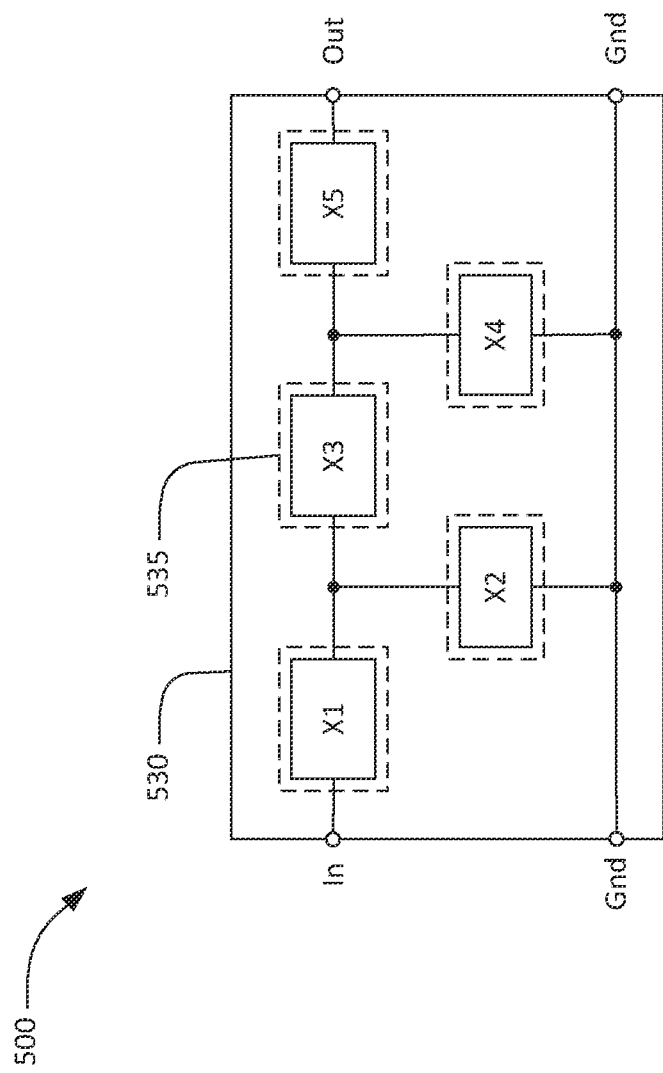
FIG. 5 is a schematic circuit diagram of a band-pass filter using acoustic resonators in a ladder circuit.

FIG. 5 is a schematic circuit diagram of a band-pass filter 500 using five XBARs X1-X5. The filter 500 may be, for example, a band n79 band-pass filter for use in a communication device. The filter 500 has a conventional ladder filter architecture including three series resonators X1, X3, X5 and two shunt resonators X2, X4. The three series resonators X1, X3, X5 are connected in series between a first port and a second port. In FIG. 5, the first and second ports are labeled "In" and "Out", respectively. However, the filter 500 is symmetrical and either port may serve as the input or output of the filter. The two shunt resonators X2, X4 are connected from nodes between the series resonators to ground. All the shunt resonators and series resonators are XBARs.

The three series resonators X1, X3, X5 and the two shunt resonators X2, X4 of the filter 500 may be formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, an IDT of each resonator is disposed over a respective cavity. In other filters, the IDTs of two or more resonators may be disposed over a common cavity. Resonators may also be divided into multiple sub-resonators with IDTs formed over respective cavities.

Each of the resonators X1 to X5 has a resonance frequency and an anti-resonance frequency. In simplified terms, each resonator is effectively a short circuit at its resonance frequency and effectively an open circuit at its anti-resonance frequency. Each resonator X1 to X5 creates a "transmission zero", where the transmission between the in and out ports of the filter is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, the anti-resonance frequencies of the series resonators are above the passband, and the resonance frequencies of the shunt resonators are below the passband.

Figure 6:
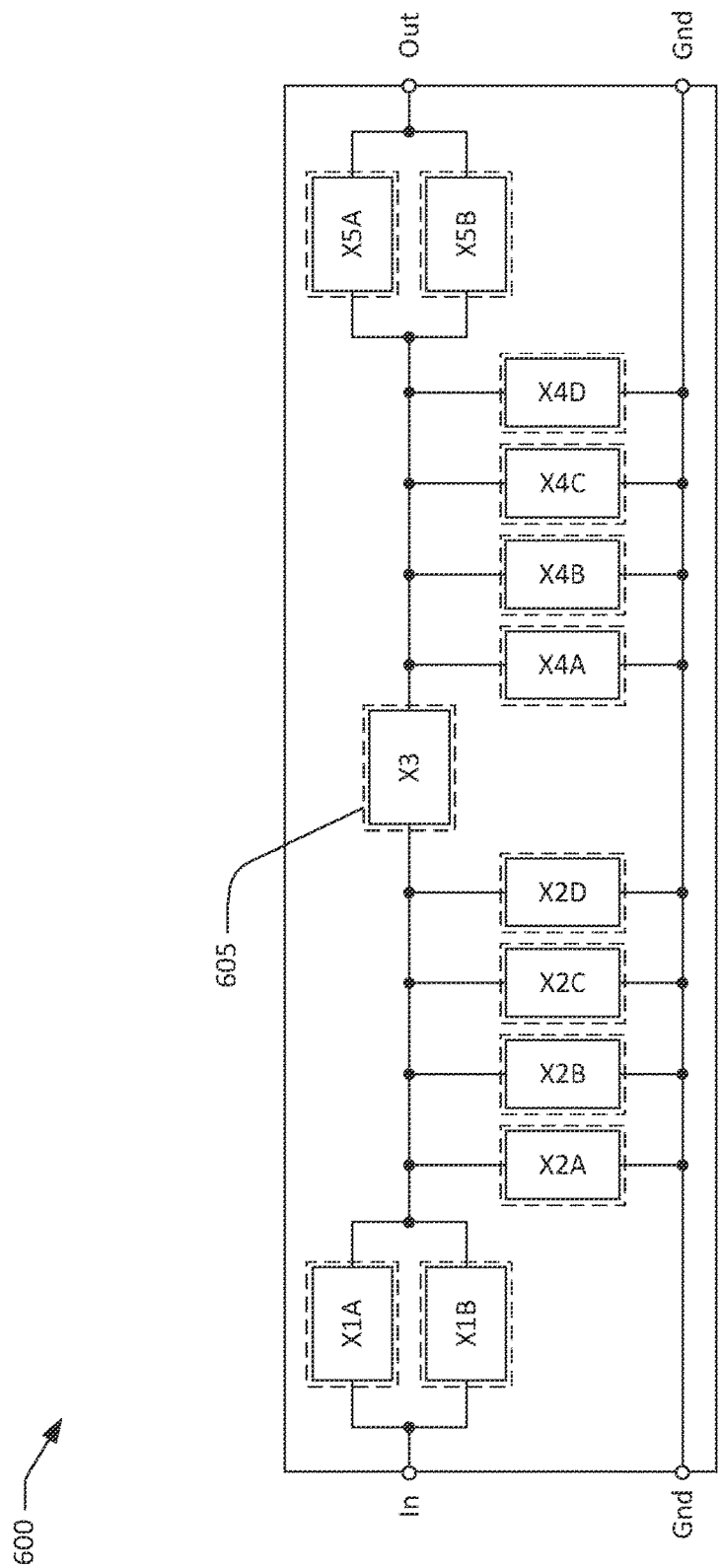
FIG. 6 is a schematic circuit diagram of an exemplary high-power band-pass filter using XBARs.

FIG. 6 is a schematic diagram of an exemplary XBAR band-pass filter. The circuit of the band-pass filter 600 is a five-resonator ladder filter, similar to that of FIG. 5. Series resonators X1 and X5 are each partitioned into two sub-resonators (X1A/B and X5A/B, respectively) connected in parallel. Shunt resonators X2 and X4 are each divided into four sub-resonators (X2A/B/C/D and X4A/B/C/D, respectively) that are connected in parallel. Dividing the resonators into two or four sub-resonators has the benefit of reducing the length and/or width of each diaphragm. Reducing the diaphragm dimensions is effective to increase the mechanical rigidity of the diaphragm. Reducing the membrane width is further beneficial for reducing parasitic resistivity in IDTs through keeping the XBAR aperture narrower. Each of the sub-resonators is formed over a respective cavity, which are indicated by dashed rectangles (such as dashed rectangle 605).

The sub-resonators within a resonator are typically, but not necessarily, electrically and physically the same, which is to say the sub-resonators share a common aperture, a common length, a common pitch and a common IDT finger width or mark. The resonance and anti-resonance frequencies of all sub-resonators of a resonator need not be precisely the same. The frequency offset between the resonance frequencies of the sub-resonators of a shunt resonator should be no more than a few percent of the difference between the resonance and anti-resonance frequencies of the resonator. The frequency offset between the anti-resonance frequencies of the sub-resonators of a series resonator should be no more than a few percent of the difference between the resonance and anti-resonance frequencies of the resonator.

Figure 7:
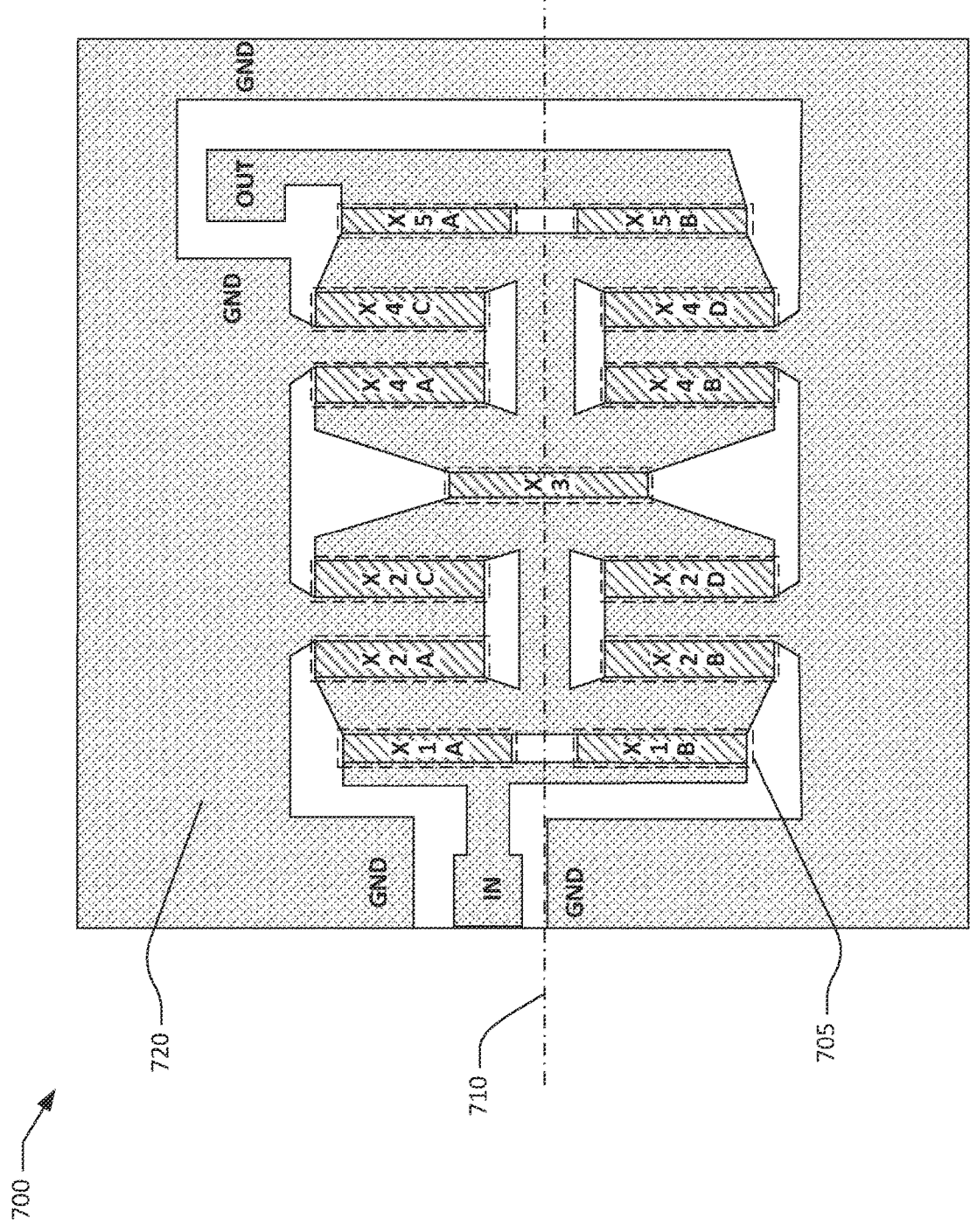
FIG. 7 is a layout of the filter of FIG. 6.

FIG. 7 shows an exemplary layout 700 for the band-pass filter 600. Cross-hatched rectangles represent the interleaved fingers of resonators and sub-resonators. Shaded areas 720 represent conductors formed on the surface of a piezoelectric plate. Dashed rectangles, such as the dashed rectangle 705, represent cavities underlying the resonators and sub-resonators. The dimensions of the various elements are not necessarily drawn to scale and the relative size and position of various elements may be distorted for ease of presentation.

In this example, the sub-resonators are arranged symmetrically in pairs about a central axis 710. The central axis 710 is a straight line that divides the filter into two sections of roughly equal area. For example, sub-resonators X1A and X1B form a pair and are disposed in symmetric positions on either side of the central axis 710. The two sub-resonators X1A and X1B are arranged in-line along the direction normal to the central axis and are equally spaced from the central axis. Similarly, sub-resonator pairs X2A/X2B, X2C/X2D, X4A/X4B, X4C/X4D, and X5A/X5B are disposed in symmetric positions with respect to the central axis 710. The signal path flows generally along the central axis 710.

The symmetrical arrangement of the sub-resonators about the central axis 710 results in an even distribution of the resonators and cavities over the area of the filter. Symmetrical arrangement of the sub-resonators about the central axis 710 also facilitates simple conductor routing between resonators, which avoids long conductors that can introduce undesired inductance and coupling between elements of the filter. For example, imagine resonator X2 is not divided into sub-resonators, but is a single resonator having twice the length and twice the width of the sub-resonators shown in FIG. 7. The left side (all directions refer to FIG. 7) of X2 can be directly connected to resonator X1 and the right side of X2 is connected to a ground conductor. The connection between X1 and X3 must be routed around X2, resulting in a much longer conductor that is parallel to ground conductors for much of its length. The longer conductor results in additional inductance in the connection between X1 and X3 and increased stray capacitance to ground.

Further, positioning shunt resonator segments as shown in FIG. 7 minimizes the distance between the center of each resonator portion and the wide ground conductors at the top and bottom (as seen in FIG. 7) of the device. Shortening this distance facilitates removing heat from the shunt resonator segments.

Series resonator X3, which is not divided into sub-resonators, is disposed along, and roughly bisected by, central axis 710. In other filters, the input port IN and the output port OUT may also be disposed along the central axis 710.

The layout of a filter must include conductors that interconnect XBAR devices with the filter. These conductors result in parasitic capacitors and/or inductors that can adversely affect filter performance. In particular, differences in interconnect/conductor length between individual sub-resonators connected in parallel may result in a difference in reactive loading, which, in turn, may result in a difference in effective resonance frequencies. These resonance frequency offsets may create a local transmission minimum that can appear as a spur in the filter response. Electromagnetic effects that can lead to the creation of these die layout-induced spurs must be considered to prevent or reduce these effects.

As discussed above, multiple XBARs are often used in a parallel configuration to realize a filter device with a desired C0. Reactive loading of the die-level conductors (e.g., metal traces) causes the resonance of each XBAR to shift down in frequency. The resonance shift depends on the amount of reactive loading (i.e., interconnect impedance and electrical length) and Lm (motional inductance) of the XBAR. If the die-level XBAR conductors corresponding to each parallel XBAR are of different length and/or impedance, the difference in reactive loading causes offsets in the effective resonance of each XBAR. Offsets in the XBAR effective resonant frequencies create local transmission minimum, which in turn can create undesirable spurious modes in the filter response. The magnitude of the filter device passband spurs depends on the frequency offset of the effective resonances, which are dependent on differences in conductor path length and impedance, Lm, Q of the XBARs, and specifics of the filter design such as bandwidth and location of the XBAR in the filter.

Figure 8:
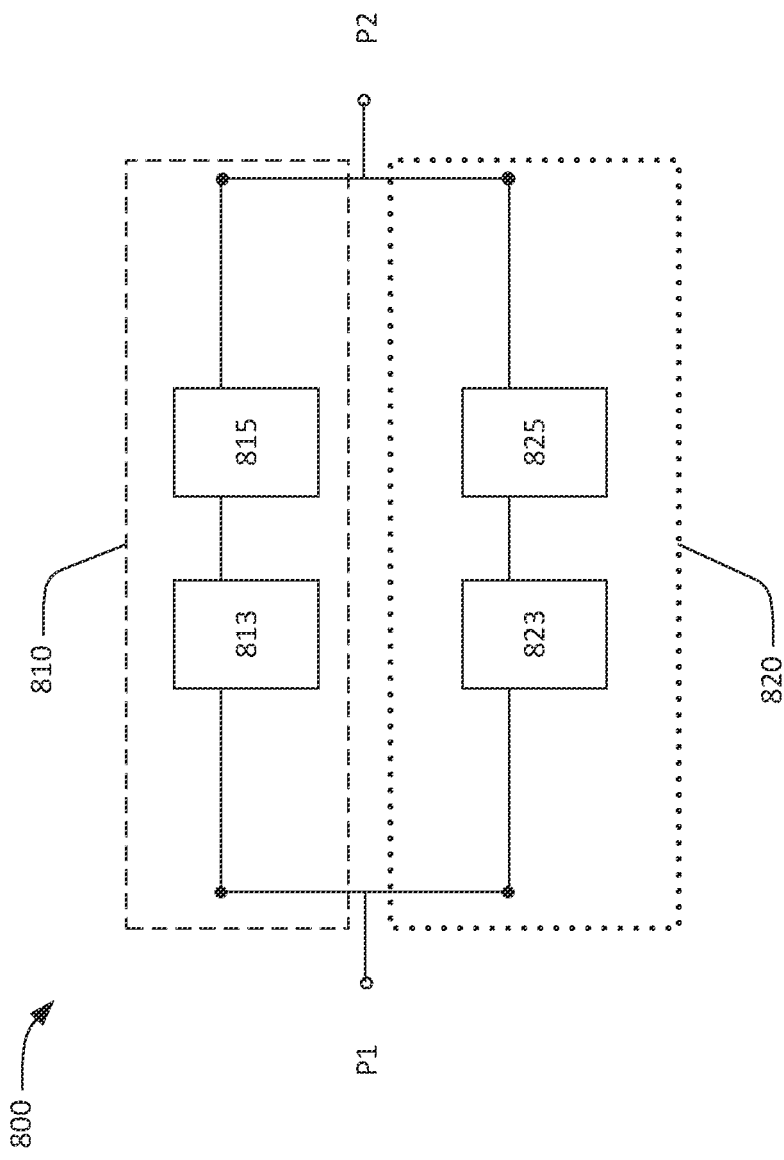
FIG. 8 is a schematic diagram of a circuit with two sub-resonators in parallel.

FIG. 8 is a schematic diagram of a circuit 800 with two sub-resonators in parallel. The circuit 800 has two exemplary electrical paths between nodes P1 and P2, a first path 810 (within the dashed box) through a first XBAR 815 and a second path 820 (within the dotted box) through a second XBAR 825. The conductors for each electrical path are modeled as transmission lines. Transmission line 813 has an electrical length theta 1 for the first path 810. Transmission line 823 has an electrical length theta 2 for the second path 820. Electrical length is expressed as a phase shift at the resonance frequency of the XBARs 815, 825. An assumed difference in electrical length for the first and second paths is theta1−theta2=4 degrees. Conductor reactive loading shared between the first path 810 and the second path 820 (i.e., external to the circuit) is not considered for this example.

Figure 9:
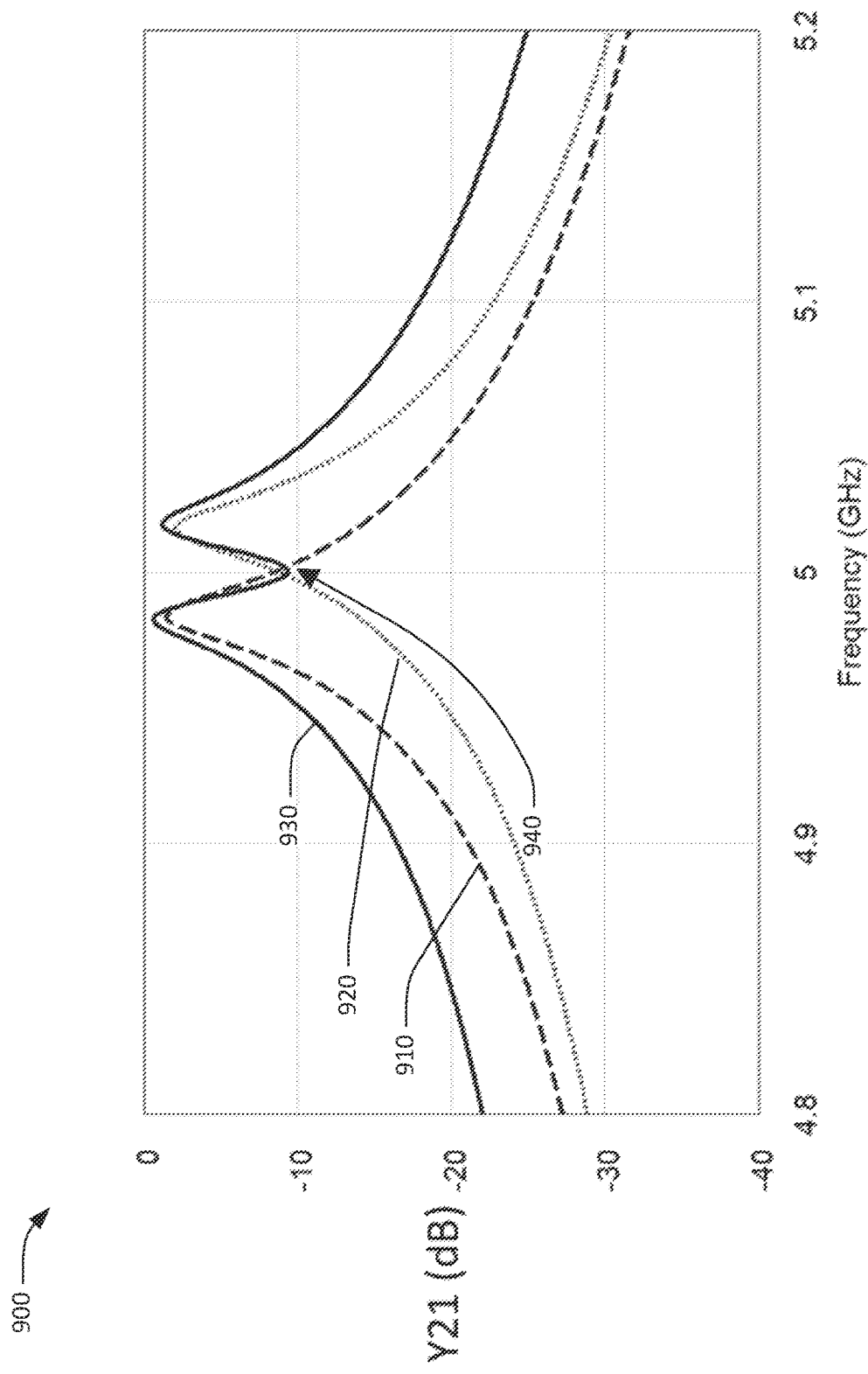
FIG. 9 is a graph of the simulated performance of the circuit with two sub-resonators of FIG. 8.

FIG. 9 is a graph of the simulated performance of the circuit with two sub-resonators of FIG. 8. The dashed curve 910 is a plot of the magnitude of admittance (Y21) of the first path 810 shown in FIG. 8. The dot curve 920 is a plot the magnitude of admittance (Y21) of the second path 820 shown in FIG. 8. The solid curve 930 is a plot of transmission S21. The difference in electrical length results in a difference in reactive loading between the paths that shifts the resonance frequency of the first path down with respect to the second path, creating an asymmetric response. Point 940 is a transmission minimum resulting from the difference. If the shift in resonance frequency between the paths is large enough, a spur that significantly impacts performance of the device will be created. In one example, a 5-degree phase deviation would be significant. However, the magnitude of a phase deviation that would be significant for a particular application is related to resonance frequency and other performance requirements of that application.

Figure 10:
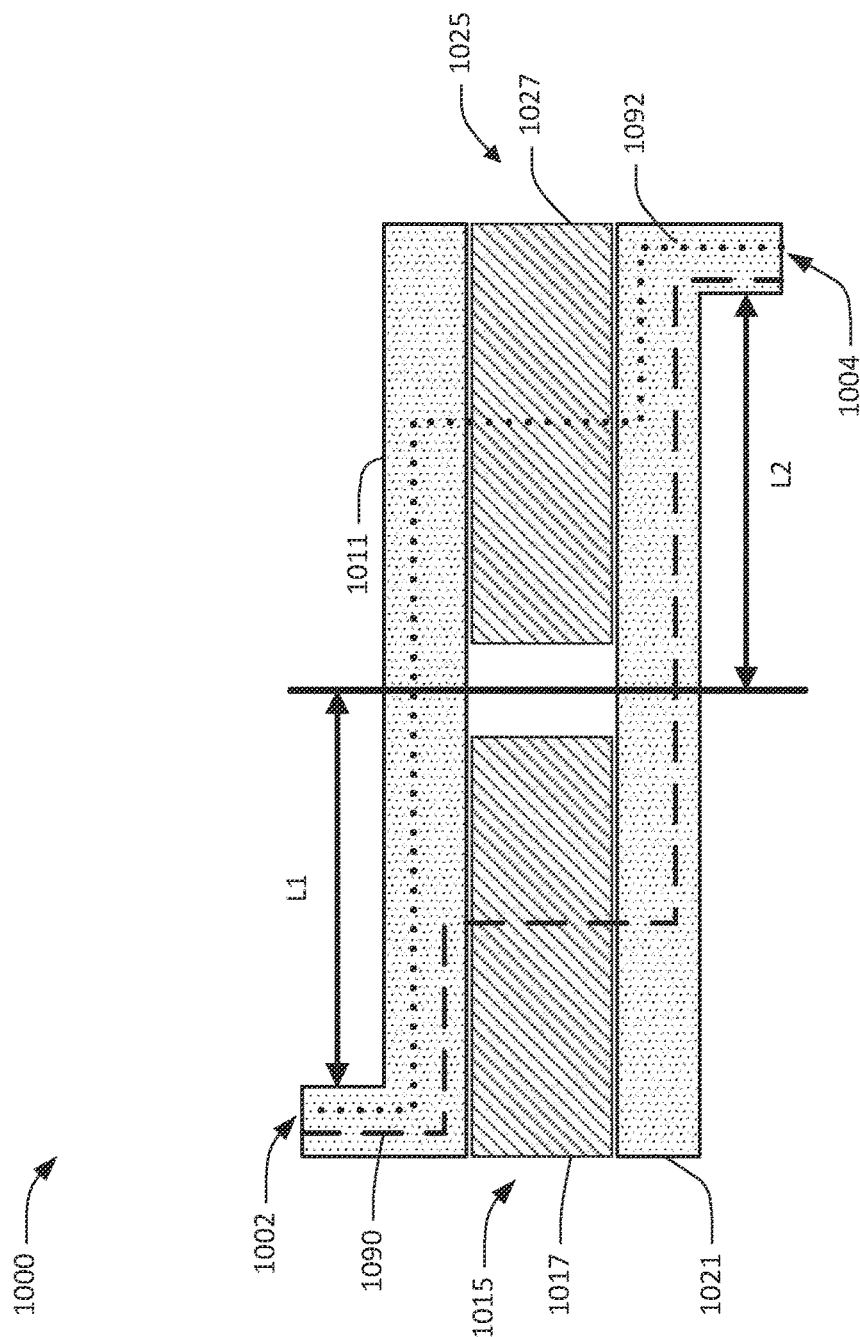
FIG. 10 is a schematic diagram of a layout of sub-resonators and conductors connecting the sub-resonators in parallel.

FIG. 10 is a schematic diagram of an XBAR filter device layout 1000 of sub-resonators connected in parallel by interconnects. A first sub-resonator 1015 and a second sub-resonator 1025 are connected in parallel between a first port 1002 and a second port 1004 by a first interconnect 1011 and a second interconnect 1021. The first sub-resonator 1015 includes an IDT with interleaved fingers 1017 where the busbars of the IDT are a portion of the first interconnect 1011 and the second interconnect 1021. The second sub-resonator 1025 includes an IDT with interleaved fingers 1027 where the busbars of the IDT are another portion of the first interconnect 1011 and the second interconnect 1021. The interleaved fingers 1017 and 1027 can either be on a diaphragm (as discussed with respect to FIG. 1) or on a piezoelectric plate solidly mounted on a Bragg reflector (as discussed with respect to FIG. 2). A first path 1090 between the first port 1002 and the second port 1004 goes through the first interconnect 1011, the first sub-resonator 1015, and the second interconnect 1021. A second path goes through the first interconnect 1011, the second sub-resonator 1025, and the second interconnect 1021. In this example, the layout 1000 prevents creation of a significant spur. The key to preventing layout-induced spurs is connecting parallel resonators with conductors of effectively the same electrical length. The degree of interconnect length similarity required, L1=L2+/– a difference X, where X is a difference in the path lengths, can be determined such that any spur present does not exceed acceptable performance requirements for the filter device. In other words, the electrical lengths, the impedance, and/or the reactive loading of the first path 1090 and the second path 1092 are "effectively the same" if the interconnects and sub-resonators collectively do not cause a spur that prevents the filter from meeting performance requirements.

Figure 11:
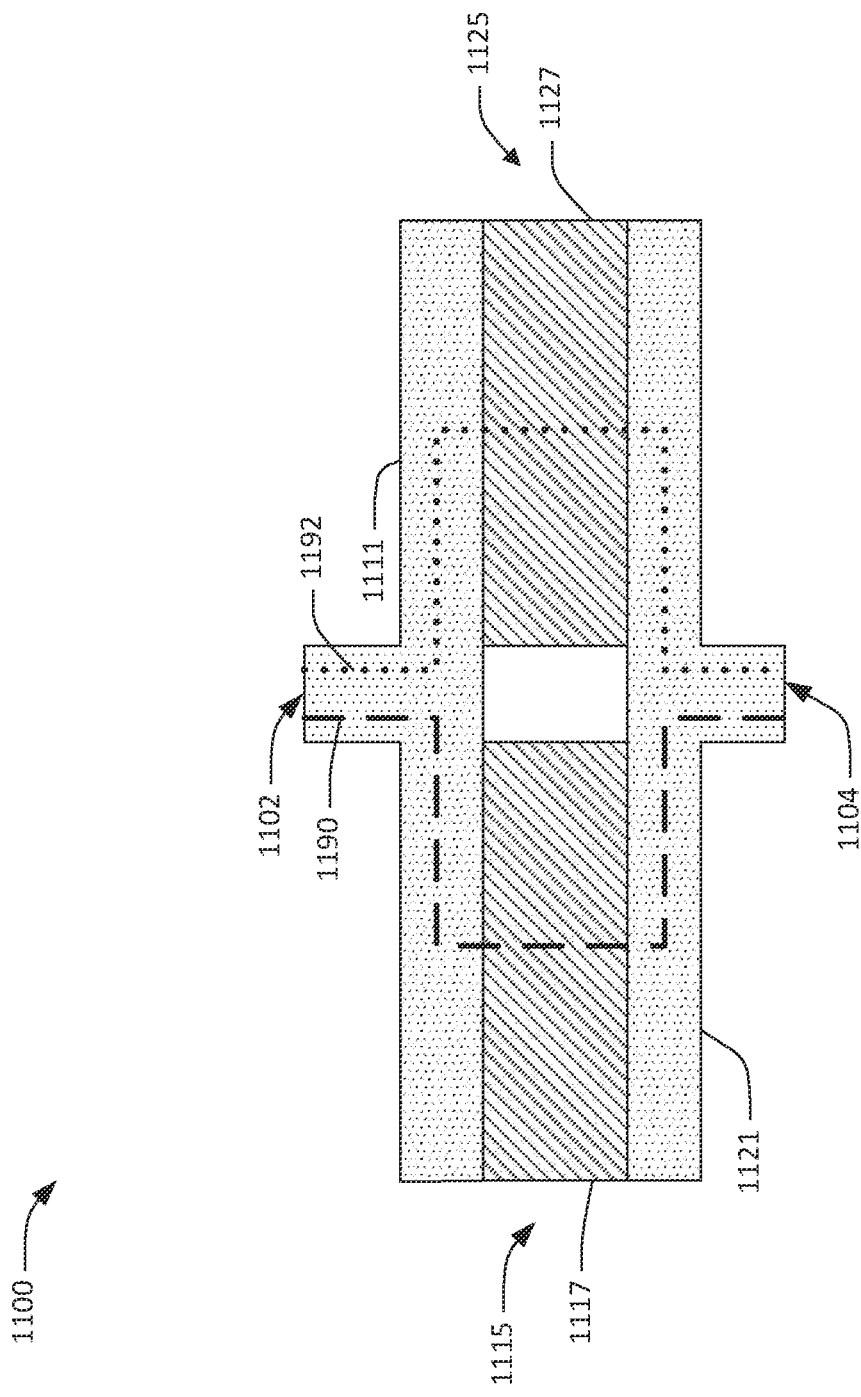
FIG. 11 is a schematic diagram of another layout of sub-resonators and conductors connecting the sub-resonators in parallel.

FIG. 11 is a schematic diagram of another XBAR filter device layout 1100 of sub-resonators and conductors connecting the sub-resonators in parallel. A first sub-resonator 1115 and a second sub-resonator 1125 are connected in parallel between a first port 1102 and a second port 1104 by a first interconnect 1111 and a second interconnect 1121. The first sub-resonator 1115 includes an IDT with interleaved fingers 1117 where the busbars of the IDT are a portion of the first interconnect 1111 and the second interconnect 1121. The second sub-resonator 1125 includes an IDT with interleaved fingers 1127 where the busbars of the IDT are another portion of the first interconnect 1111 and the second interconnect 1121. The interleaved fingers 1117 and 1127 can either be on a diaphragm (as discussed with respect to FIG. 1) or on a piezoelectric plate solidly mounted on a Bragg reflector (as discussed with respect to FIG. 2). A first path 1190 between the first port 1102 and the second port 1104 goes through the first interconnect 1111, the first sub-resonator 1115, and the second interconnect 1121. A second path 1192 goes through the first interconnect 1111, the second sub-resonator 1125, and the second interconnect 1121. In this example, the layout 1100 prevents creation of a significant spur because the electrical lengths of the first path 1190 and the second path 1192 are sufficiently similar.

Figure 12:
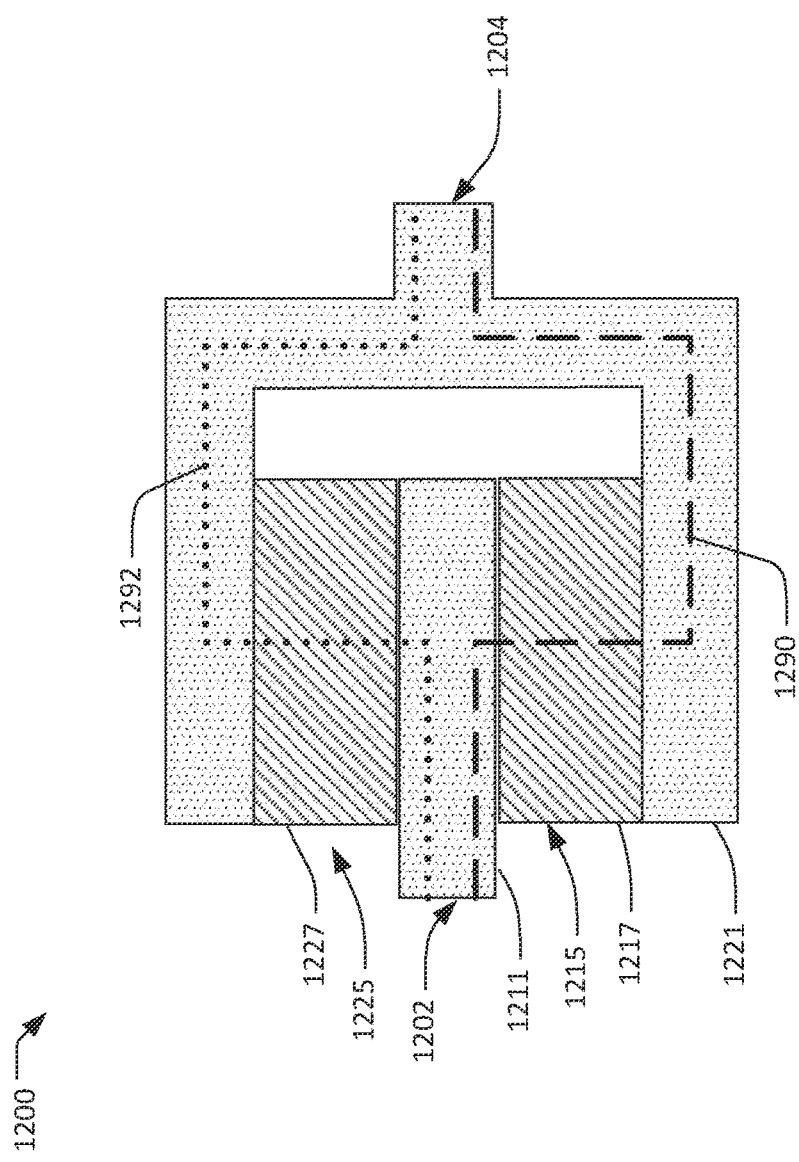
FIG. 12 is a schematic diagram of another layout of sub-resonators and conductors connecting the sub-resonators in parallel.

FIG. 12 is a schematic diagram of another XBAR filter device layout 1200 of sub-resonators and conductors connecting the sub-resonators in parallel. A first sub-resonator 1215 and a second sub-resonator 1225 are connected in parallel between a first port 1202 and a second port 1204 by a first interconnect 1211 and a second interconnect 1221. The first sub-resonator 1215 includes an IDT with interleaved fingers 1217 where the busbars of the IDT are a portion of the first interconnect 1211 and the second interconnect 1221. The second sub-resonator 1225 includes an IDT with interleaved fingers 1227 where the busbars of the IDT are another portion of the first interconnect 1211 and the second interconnect 1221. The interleaved fingers 1217 and 1227 can either be on a diaphragm (as discussed with respect to FIG. 1) or on a piezoelectric plate solidly mounted on a Bragg reflector (as discussed with respect to FIG. 2). A first path 1290 between the first port 1202 and the second port 1204 goes through the first interconnect 1211, the first sub-resonator 1215, and the second interconnect 1221. A second path 1292 goes through the first interconnect 1211, the second sub-resonator 1225, and the second interconnect 1221. In this example, the layout 1200 prevents creation of a significant spur because the electrical lengths of the first path 1290 and the second path 1292 are sufficiently similar.

Figure 13:
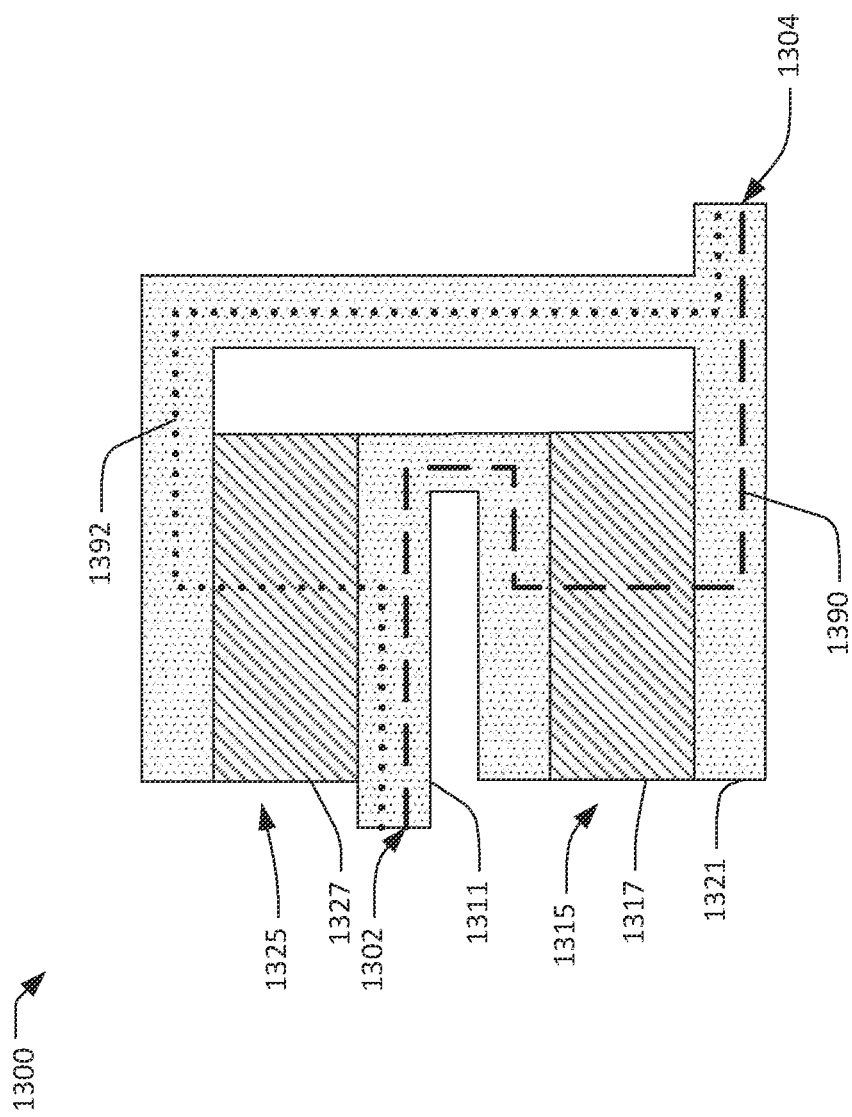
FIG. 13 is a schematic diagram of another layout of sub-resonators and conductors connecting the sub-resonators in parallel.

FIG. 13 is a schematic diagram of another XBAR filter device layout 1300 of sub-resonators and conductors connecting the sub-resonators in parallel. A first sub-resonator 1315 and a second sub-resonator 1325 are connected in parallel between a first port 1302 and a second port 1304 by a first interconnect 1311 and a second interconnect 1321. The first sub-resonator 1315 includes an IDT with interleaved fingers 1317 where the busbars of the IDT are a portion of the first interconnect 1311 and the second interconnect 1321. The second sub-resonator 1325 includes an IDT with interleaved fingers 1327 where the busbars of the IDT are another portion of the first interconnect 1311 and the second interconnect 1321. The interleaved fingers 1317 and 1327 can either be on a diaphragm (as discussed with respect to FIG. 1) or on a piezoelectric plate solidly mounted on a Bragg reflector (as discussed with respect to FIG. 2). A first path 1390 between the first port 1302 and the second port 1304 goes through the first interconnect 1311, the first sub-resonator 1315, and the second interconnect 1321. A second path goes 1392 through the first interconnect 1311, the second sub-resonator 1325, and the second interconnect 1321. In this example, the layout 1300 prevents creation of a significant spur because the electrical lengths of the first path 1390 and the second path 1392 are sufficiently similar.

Figure 14:
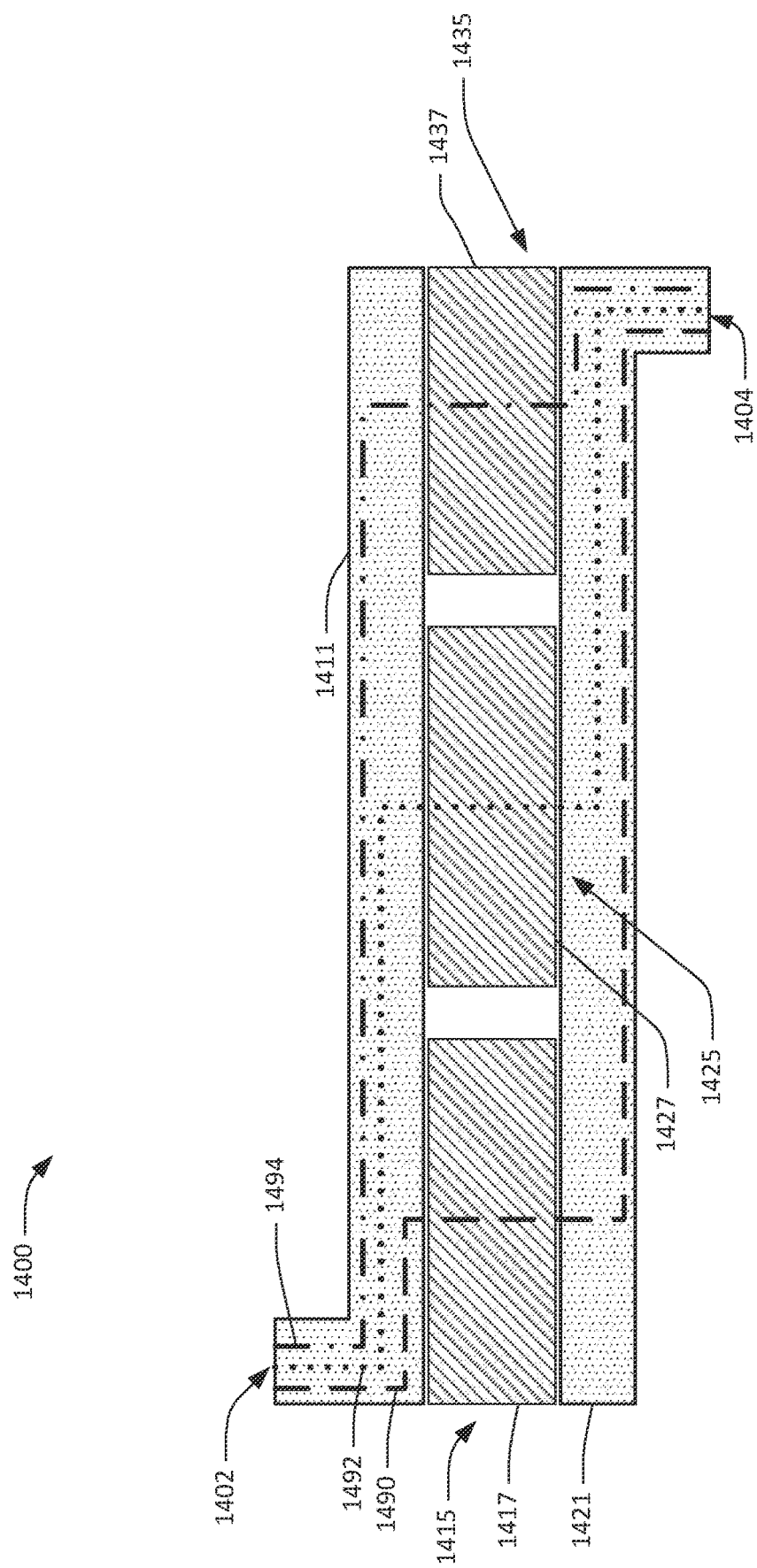
FIG. 14 is a schematic diagram of another layout of sub-resonators and conductors connecting the sub-resonators in parallel.

FIG. 14 is a schematic diagram of another XBAR filter device layout 1400 of sub-resonators and conductors connecting the sub-resonators in parallel. A first sub-resonator 1415, a second sub-resonator 1425, and a third sub-resonator 1435 are connected in parallel between a first port 1402 and a second port 1404 by a first interconnect 1411 and a second interconnect 1421. The first sub-resonator 1415 includes an IDT with interleaved fingers 1417 where the busbars of the IDT are a portion of the first interconnect 1411 and the second interconnect 1421. The second sub-resonator 1425 includes an IDT with interleaved fingers 1427 where the busbars of the IDT are another portion of the first interconnect 1411 and the second interconnect 1421. The third sub-resonator 1435 includes an IDT with interleaved fingers 1437 where the busbars of the IDT are another portion of the first interconnect 1411 and the second interconnect 1421. The interleaved fingers 1417, 1427, and 1437 can either be on a diaphragm (as discussed with respect to FIG. 1) or on a piezoelectric plate solidly mounted on a Bragg reflector (as discussed with respect to FIG. 2). A first path 1490 between the first port 1402 and the second port 1404 goes through the first interconnect 1411, the first sub-resonator 1415, and the second interconnect 1421. A second path 1492 goes through the first interconnect 1411, the second sub-resonator 1425, and the second interconnect 1421. A third path 1494 goes through the first interconnect 1411, the third sub-resonator 1435, and the second interconnect 1421. In this example, the layout 1400 prevents creation of a significant spur because the electrical lengths of the first path 1490, the second path 1492, and third path 1494 are sufficiently similar.

Figure 15:
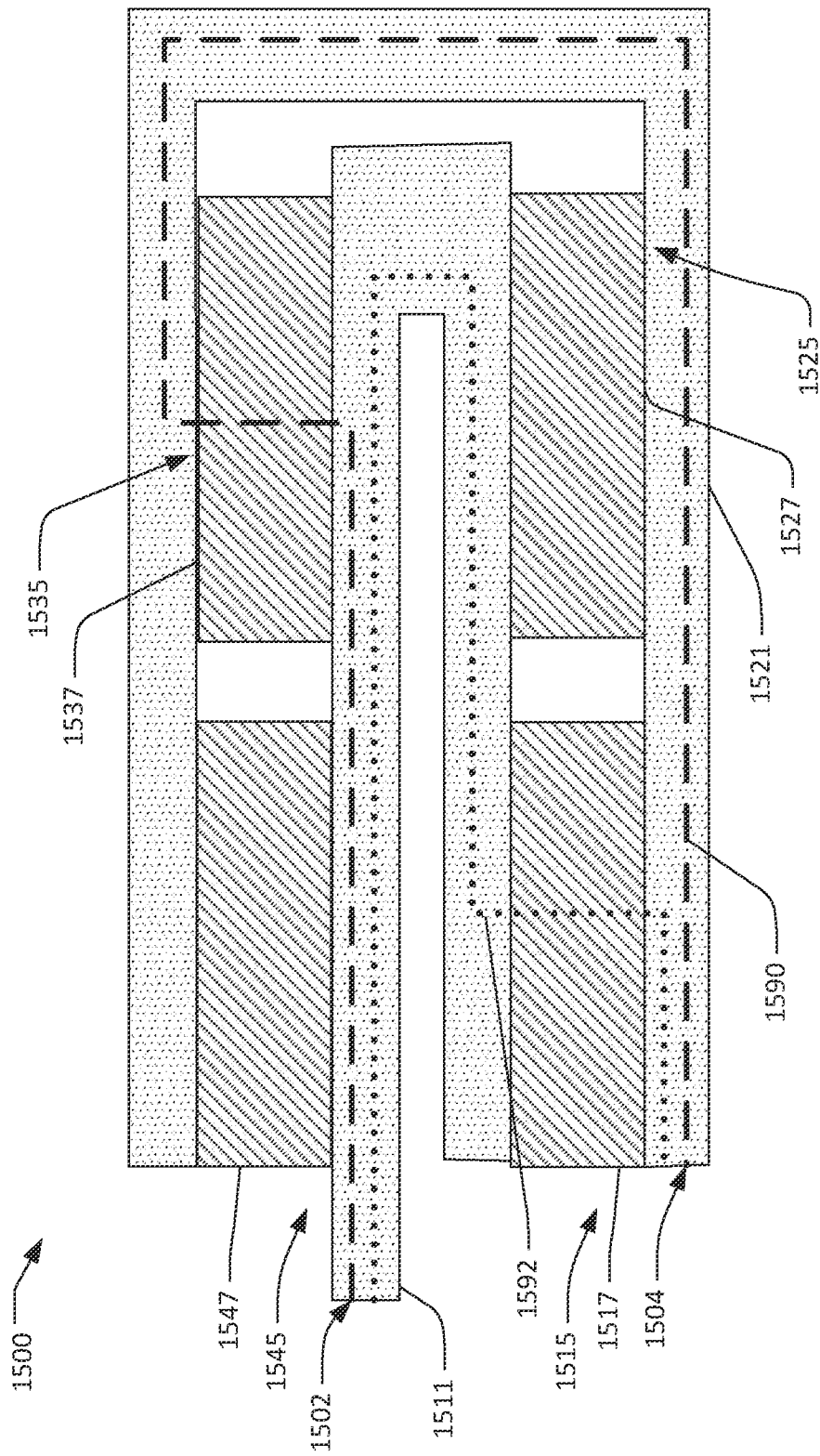
FIG. 15 is a schematic diagram of another layout of sub-resonators and conductors connecting the sub-resonators in parallel.

FIG. 15 is a schematic diagram of another XBAR filter device layout 1500 of sub-resonators and conductors connecting the sub-resonators in parallel. A first sub-resonator 1515, a second sub-resonator 1525, a third sub-resonator 1535, and a fourth sub-resonator 1545 are connected in parallel between a first port 1502 and a second port 1504 by a first interconnect 1511 and a second interconnect 1521. The first sub-resonator 1515 includes an IDT with interleaved fingers 1517 where the busbars of the IDT are a portion of the first interconnect 1511 and the second interconnect 1521. The second sub-resonator 1525 includes an IDT with interleaved fingers 1527 where the busbars of the IDT are another portion of the first interconnect 1511 and the second interconnect 1521. The third sub-resonator 1535 includes an IDT with interleaved fingers 1537 where the busbars of the IDT are another portion of the first interconnect 1511 and the second interconnect 1521. The fourth sub-resonator 1545 includes an IDT with interleaved fingers 1547 where the busbars of the IDT are another portion of the first interconnect 1511 and the second interconnect 1521. The interleaved fingers 1517, 1527, 1537, and 1547 can either be on a diaphragm (as discussed with respect to FIG. 1) or on a piezoelectric plate solidly mounted on a Bragg reflector (as discussed with respect to FIG. 2). A representative first path 1590 between the first port 1502 and the second port 1504 goes through the first interconnect 1511, the third sub-resonator 1535, and the second interconnect 1521. A representative second path 1592 goes through the first interconnect 1511, the second sub-resonator 1515, and the second interconnect 1521. In this example, while the electrical lengths of the first path 1590, the second path 1592, and the other unmarked paths are not identical, they are sufficiently similar (i.e., having a difference within an acceptable range) such that the layout 1500 prevents creation of a significant spur.

DESCRIPTION OF METHODS

Figure 16:
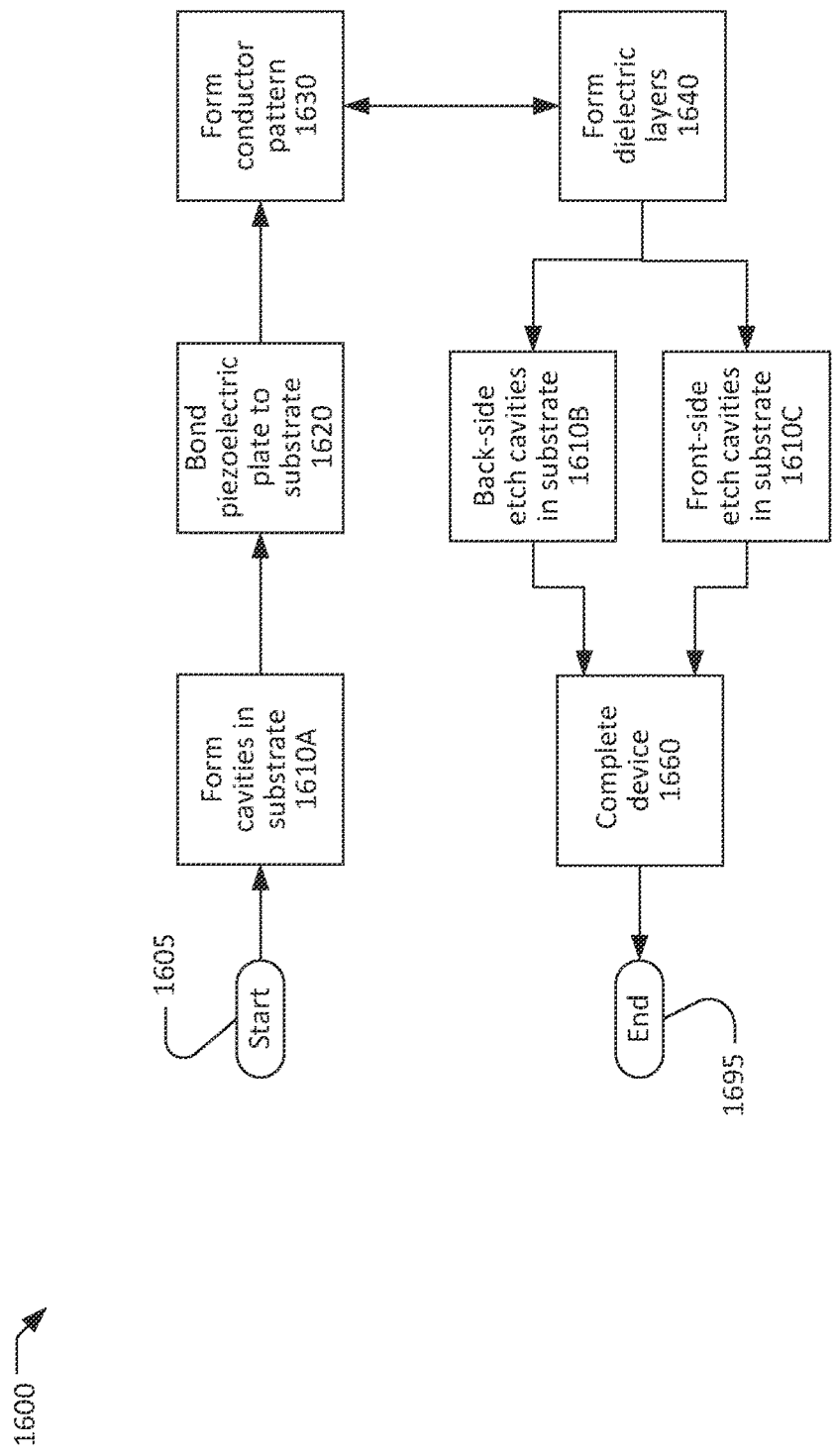
FIG. 16 is a flow chart of a process for making an XBAR filter device.

FIG. 16 is a simplified flow chart showing a process 1600 for making an XBAR or a filter incorporating XBARs, e.g., sub-resonators in parallel between a first node and a second node. The process 1600 starts at 1605 with a substrate and a plate of piezoelectric material and ends at 1695 with a completed XBAR or filter. The flow chart of FIG. 16 includes only major process steps. Various conventional process steps (e.g. surface preparation, cleaning, inspection, baking, annealing, monitoring, testing, etc.) may be performed before, between, after, and during the steps shown in FIG. 16.

The flow chart of FIG. 16 captures three variations of the process 1600 for making an XBAR or filter device which differ in when and how cavities are formed in the substrate. The cavities may be formed at steps 1610A, 1610B, or 1610C. Only one of these steps is performed in each of the three variations of the process 1600.

The piezoelectric plate may be, for example, Z-cut lithium niobate or lithium tantalate with Euler angles 0, 0, 90°. The piezoelectric plate may be rotated Z-cut lithium niobate with Euler angles 0, β, 90°, where β is in the range from −15° to +5°. The piezoelectric plate may be rotated Y-cut lithium niobate or lithium tantalate with Euler angles 0, β, 0, where β is in the range from 0 to 60°. The piezoelectric plate may be some other material or crystallographic orientation. The substrate may preferably be silicon. The substrate may be some other material that allows formation of deep cavities by etching or other processing.

In one variation of the process 1600, one or more cavities are formed in the substrate at 1610A, before the piezoelectric plate is bonded to the substrate at 1620. A separate cavity may be formed for each resonator in a filter device. The one or more cavities may be formed using conventional photolithographic and etching techniques. Typically, the cavities formed at 1610A will not penetrate through the substrate.

At 1620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1630 by depositing and patterning one or more conductor levels on the front side of the piezoelectric plate. The conductor levels typically include a first conductor level that includes the IDT fingers, and a second conductor level formed over the IDT busbars and other conductors except the IDT fingers. In some devices, a third conductor levels may be formed on the contact pads. Each conductor level may be one or more layers of, for example, aluminum, an aluminum alloy, copper, a copper alloy, or some other conductive metal. Optionally, one or more layers of other materials may be disposed below (i.e. between each conductor layer and the piezoelectric plate) and/or on top of each conductor layer. For example, a thin film of titanium, chrome, or other metal may be used to improve the adhesion between the first conductor level and the piezoelectric plate. The second conductor level may be a conduction enhancement layer of gold, aluminum, copper or other higher conductivity metal may be formed over portions of the first conductor level (for example the IDT bus bars and interconnections between the IDTs).

Each conductor level may be formed at 1630 by depositing the appropriate conductor layers in sequence over the surface of the piezoelectric plate. The excess metal may then be removed by etching through patterned photoresist. The conductor level can be etched, for example, by plasma etching, reactive ion etching, wet chemical etching, and other etching techniques.

Alternatively, each conductor level may be formed at 1630 using a lift-off process. Photoresist may be deposited over the piezoelectric plate. and patterned to define the conductor level. The appropriate conductor layers may be deposited in sequence over the surface of the piezoelectric plate. The photoresist may then be removed, which removes the excess material, leaving the conductor level.

When a conductor level has multiple layers, the layers may be deposited and patterned separately. In particular, different patterning processes (i.e. etching or lift-off) may be used on different layers and/or levels and different masks are required where two or more layers of the same conductor level have different widths or shapes.

The conductors can be configured such that an electrical path length, impedance, and/or reactive loading between the first node and the second node is effectively the same through each of the XBARs or sub-resonators.

At 1640, dielectric layers may be formed by depositing one or more layers of dielectric material on the front side of the piezoelectric plate. As previously described, the dielectric layers may include a different dielectric thickness over the IDT fingers of the XBARs within each sub-filter. Each dielectric layer may be deposited using a conventional deposition technique such as sputtering, evaporation, or chemical vapor deposition. Each dielectric layer may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 1600, one or more cavities are formed in the back side of the substrate at 1610B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In a third variation of the process 1600, one or more cavities in the form of recesses in the substrate may be formed at 1610C by etching the substrate using an etchant introduced through openings in the piezoelectric plate. A separate cavity may be formed for each resonator in a filter device.

In all variations of the process 1600, the filter device is completed at 1660. Other actions that may occur at 1660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1660 is to tune the resonant frequencies of the resonators within the device by adding or removing metal or dielectric material from the front side of the device. After the filter device is completed, the process ends at 1695.

Figure 17:
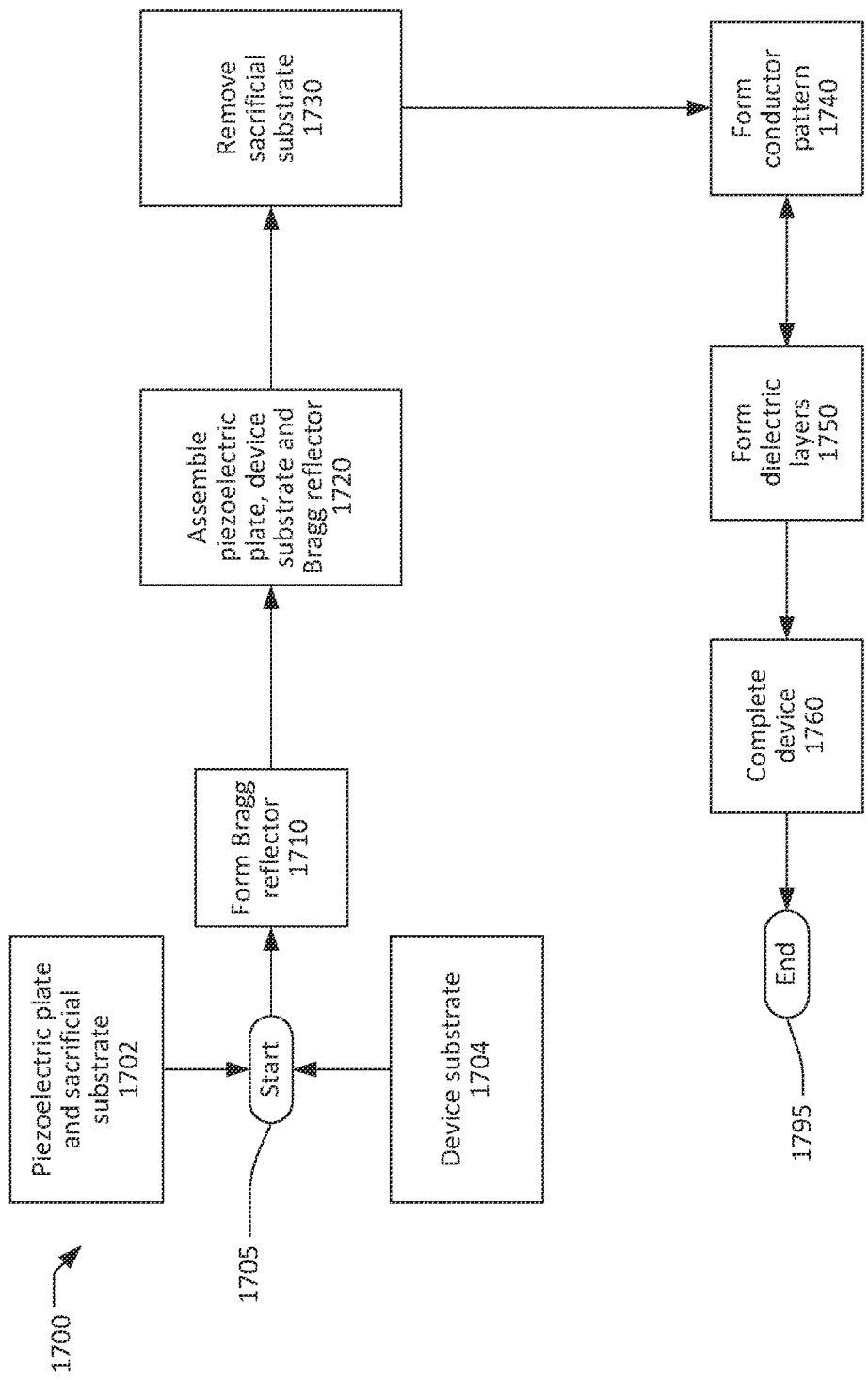
FIG. 17 is a flow chart of another process for making an XBAR filter device.

FIG. 17 is a simplified flow chart showing another process 1700 for making an XBAR or a filter incorporating XBARs, e.g., sub-resonators in parallel between a first node and a second node. The process 1700 starts at 1705 with a device substrate 1704 and a piezoelectric plate on a sacrificial substrate, and ends at 1795 with a completed XBAR or filter. The flow chart of FIG. 17 includes only major process steps. Various conventional process steps (e.g. surface preparation, cleaning, inspection, baking, annealing, monitoring, testing, etc.) may be performed before, between, after, and during the steps shown in FIG. 17.

The piezoelectric plate may be, for example, Z-cut lithium niobate or lithium tantalate with Euler angles 0, 0, 90°. The piezoelectric plate may be rotated Z-cut lithium niobate with Euler angles 0, β, 90°, where β is in the range from −15° to +5°. The piezoelectric plate may be rotated Y-cut lithium niobate or lithium tantalate with Euler angles 0, β, 0, where β is in the range from 0 to 60°. The piezoelectric plate may be some other material or crystallographic orientation. The substrate may preferably be silicon. The substrate may be some other material that allows formation of deep cavities by etching or other processing.

At 1710, an acoustic Bragg reflector is formed by depositing alternating dielectric layers of high acoustic impedance and low acoustic impedance materials. Each of the layers has a thickness equal to or about one-fourth of the acoustic wavelength. Dielectric materials having comparatively low acoustic impedance include silicon dioxide, carbon-containing silicon oxide, and certain plastics such as cross-linked polyphenylene polymers. Dielectric materials having comparatively high acoustic impedance include silicon nitride and aluminum nitride. All of the high acoustic impedance layers are not necessarily the same material, and all of the low acoustic impedance layers are not necessarily the same material. The total number of layers in the acoustic Bragg reflector may be from about five to more than twenty.

At 1710, all of the layers of the acoustic Bragg reflector may be deposited on either the surface of the piezoelectric plate on the sacrificial substrate 1702 or a surface of the device substrate 1704. Alternatively, some of the layers of the acoustic Bragg reflector may be deposited on the surface of the piezoelectric plate on the sacrificial substrate 1702 and the remaining layers of the acoustic Bragg reflector may be deposited on a surface of the device substrate 1704.

At 1720, the piezoelectric plate on the sacrificial substrate 1702 and the device substrate 1704 may be bonded such that the layers of the acoustic Bragg reflector are between the piezoelectric plate and the device substrate. The piezoelectric plate on the sacrificial substrate 1702 and the device substrate 1704 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 1702 and the device substrate 1704 may be bonded, the sacrificial substrate, and any intervening layers, are removed at 1730 to expose the surface of the piezoelectric plate (the surface that previously faced the sacrificial substrate). The sacrificial substrate may be removed, for example, by material-dependent wet or dry etching or some other process.

A conductor pattern, including IDTs of each XBAR, is formed at 1740 by depositing and patterning conductor levels on the front side of the piezoelectric plate. The conductor levels typically include a first conductor level that includes the IDT fingers, and a second conductor level formed over the IDT busbars and other conductors except the IDT fingers. In some devices, a third conductor level may be formed on the contact pads. Each conductor level may be one or more layers of, for example, aluminum, an aluminum alloy, copper, a copper alloy, or some other conductive metal. Optionally, one or more layers of other materials may be disposed below (i.e. between each conductor layer and the piezoelectric plate) and/or on top of each conductor layer. For example, a thin film of titanium, chrome, or other metal may be used to improve the adhesion between the first conductor level and the piezoelectric plate. The second conductor level may be a conduction enhancement layer of gold, aluminum, copper or other higher conductivity metal may be formed over portions of the first conductor level (for example the IDT bus bars and interconnections between the IDTs).

Each conductor level may be formed at 1740 by depositing the appropriate conductor layers in sequence over the surface of the piezoelectric plate. The excess metal may then be removed by etching through patterned photoresist. The conductor level can be etched, for example, by plasma etching, reactive ion etching, wet chemical etching, and other etching techniques.

Alternatively, each conductor level may be formed at 1740 using a lift-off process. Photoresist may be deposited over the piezoelectric plate. and patterned to define the conductor level. The appropriate conductor layers may be deposited in sequence over the surface of the piezoelectric plate. The photoresist may then be removed, which removes the excess material, leaving the conductor level.

When a conductor level has multiple layers, the layers may be deposited and patterned separately. In particular, different patterning processes (i.e. etching or lift-off) may be used on different layers and/or levels and different masks are required where two or more layers of the same conductor level have different widths or shapes.

The conductors can be configured such that an electrical path length, impedance, and/or reactive loading between the first node and the second node is effectively the same through each of the XBARs or sub-resonators.

At 1750, dielectric layers may be formed by depositing one or more layers of dielectric material on the front side of the piezoelectric plate. As previously described, the dielectric layers may include a different dielectric thickness over the IDT fingers of the XBARs within each sub-filter. Each dielectric layer may be deposited using a conventional deposition technique such as sputtering, evaporation, or chemical vapor deposition. Each dielectric layer may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In all variations of the process 1700, the filter device is completed at 1760. Other actions that may occur at 1760 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1760 is to tune the resonant frequencies of the resonators within the device by adding or removing metal or dielectric material from the front side of the device. After the filter device is completed, the process ends at 1795.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic filter device comprising:
   a first port configured as an input of the acoustic filter device;
   a second port configured as an output of the acoustic filter device;
   a transversely-excited film bulk acoustic resonator (XBAR) comprising a plurality of sub-resonators; and
   a first interconnector and a second interconnector connecting the plurality of sub-resonators in parallel between the first port and the second port,
   wherein a first electrical path goes from the first port through the first interconnect, a first sub-resonator of the plurality of sub-resonators, and the second interconnect, to the second port,
   wherein a second electrical path goes from the first port through the first interconnect, a second sub-resonator of the plurality of sub-resonators, and the second interconnect, to the second port,
   wherein the first and second interconnectors are physically configured such that an electrical length from the first port to the second port is effectively a same electrical length for the first electrical path and the second electrical path.

2. The device of claim 1, wherein the XBAR comprises a piezoelectric layer.

3. The device of claim 2, wherein each of the plurality of sub-resonators comprises a respective portion of the piezoelectric layer over a cavity to form a respective diaphragm and a respective interdigital transducer (IDT), and wherein interleaved fingers of the respective IDT are disposed on the respective diaphragm.

4. The device of claim 2, wherein the piezoelectric layer is solidly mounted to a substrate with a Bragg reflector between the piezoelectric layer and the substrate.

5. The device of claim 2, wherein each sub-resonator comprises a plurality of interleaved fingers on the piezoelectric layer.

6. The device of claim 1, wherein a reactive loading between the first port and the second port is effectively a same reactive loading through each of the plurality of sub-resonators.

7. The device of claim 1, wherein an impedance between the first port and the second port is effectively a same impedance through each of the plurality of sub-resonators.

8. The device of claim 1, wherein the first and second interconnectors are physically configured such that at least one of an electrical path length, an impedance, and a reactive loading between the first port and the second port is effectively the same through all of the plurality of sub-resonators.

9. An acoustic filter device comprising:
   a first port configured as an input of the acoustic filter device;
   a second port configured as an output of the acoustic filter device;
   an XBAR comprising a plurality of sub-resonators; and
   a first interconnector and a second interconnector that connect the plurality of sub-resonators in parallel between the first port and the second port,
   wherein a first electrical path goes from the first port through the first interconnect, a first sub-resonator of the plurality of sub-resonators, and the second interconnect, to the second port,
   wherein a second electrical path goes from the first port through the first interconnect, a second sub-resonator of the plurality of sub-resonators, and the second interconnect, to the second port, wherein the first and second interconnectors are physically configured such that an impedance between the first port and the second port is effectively a same impedance for the first electrical path and the second electrical path.

10. The device of claim 9, wherein the XBAR comprises a piezoelectric layer.

11. The device of claim 10, wherein each of the plurality of sub-resonators comprises a respective portion of the piezoelectric layer spanning a cavity to form a respective diaphragm and a respective interdigital transducer (IDT), and wherein interleaved fingers of the respective IDT are disposed on the respective diaphragm.

12. The device of claim 10, wherein the piezoelectric layer is solidly mounted to a substrate with a Bragg reflector between the piezoelectric layer and the substrate.

13. The device of claim 10, wherein each sub-resonator comprises a plurality of interleaved fingers.

14. The device of claim 9, wherein a reactive loading between the first port and the second port is effectively a same reactive loading through each of the plurality of sub-resonators.

15. The device of claim 14, wherein the conductors are configured such that a path length from the first node to the second node is effectively a same path length through each of the plurality of sub-resonators.

16. The device of claim 9, wherein the first and second interconnectors are physically configured such that at least one of an electrical path length, an impedance, and a reactive loading between the first port and the second port is effectively the same through all of the plurality of sub-resonators.

17. A method of making an acoustic filter device comprising:

forming an XBAR comprising a plurality of sub-resonators between a first port configured as an input of the acoustic filter device and a second port configured as an output of the acoustic filter device; and forming a first interconnector and a second interconnector to connect the plurality of sub-resonators in parallel between the first port and the second port, wherein a first electrical path goes from the first port through the first interconnect, a first sub-resonator of the plurality of sub-resonators, and the second interconnect, to the second port, wherein a second electrical path goes from the first port through the first interconnect, a second sub-resonator of the plurality of sub-resonators, and the second interconnect, to the second port, wherein the first and second interconnectors are physically configured such that a path length from the first port to the port second node is effectively a same path length for the first electrical path and the second electrical path.

18. The method of claim 17, further comprising forming the XBAR to include a piezoelectric layer, and each sub-resonator to include a plurality of interleaved fingers on the piezoelectric layer.

19. The method of claim 18, further comprising forming each of the plurality of sub-resonators to include a respective portion of the piezoelectric layer spanning a cavity to form a respective diaphragm and a respective interdigital transducer (IDT), such that interleaved fingers of the respective IDT are disposed on the respective diaphragm.

20. The method of claim 18, wherein the piezoelectric layer is solidly mounted to a substrate with a Bragg reflector between the piezoelectric layer and the substrate.

* * * * *